United States Patent
Liu et al.

(10) Patent No.: US 10,853,066 B1
(45) Date of Patent: Dec. 1, 2020

(54) MEMORY PROCESSING UNITS AND METHODS OF COMPUTING DOT PRODUCTS INCLUDING ZERO BIT SKIPPING

(71) Applicant: MemryX Inc., Ann Arbor, MI (US)

(72) Inventors: Chester Liu, Ann Arbor, MI (US); Mohammed Zidan, Ann Arbor, MI (US); Wei Lu, Ann Arbor, MI (US); Zhengya Zhang, Ann Arbor, MI (US)

(73) Assignee: MemryX Incorporated, Ann Arbor, MI (US)

( * ) Notice: Subject to any disclaimer, the term of this patent is extended or adjusted under 35 U.S.C. 154(b) by 0 days.

(21) Appl. No.: 16/726,671

(22) Filed: Dec. 24, 2019

Related U.S. Application Data

(60) Provisional application No. 62/844,644, filed on May 7, 2019.

(51) Int. Cl.
| | | |
|---|---|---|
| G06F 9/30 | (2018.01) | |
| G06F 3/06 | (2006.01) | |
| G11C 11/00 | (2006.01) | |
| G11C 11/418 | (2006.01) | |
| G11C 13/00 | (2006.01) | |
| G11C 11/419 | (2006.01) | |

(52) U.S. Cl.
CPC .......... *G06F 9/3001* (2013.01); *G06F 3/0604* (2013.01); *G06F 3/0659* (2013.01); *G06F 3/0673* (2013.01); *G06F 9/30032* (2013.01); *G06F 9/30101* (2013.01); *G11C 11/005* (2013.01); *G11C 11/418* (2013.01); *G11C 11/419* (2013.01); *G11C 13/004* (2013.01); *G11C 13/0028* (2013.01)

(58) Field of Classification Search
CPC .. G06F 9/3001; G06F 3/0659; G06F 9/30032; G06F 3/0604; G06F 9/30101; G06F 3/0673; G11C 11/005; G11C 11/419; G11C 11/418; G11C 13/004; G11C 13/0028
See application file for complete search history.

(56) References Cited

U.S. PATENT DOCUMENTS

| | | | | |
|---|---|---|---|---|
| 6,026,140 A | * | 2/2000 | Owen | ..................... H03K 23/58 377/110 |
| 8,943,224 B2 | * | 1/2015 | Ware | ................... G06F 13/1684 710/3 |
| 2003/0041082 A1 | | 2/2003 | Dibrino | |
| 2004/0076044 A1 | | 4/2004 | Nowshadi | |
| 2004/0213036 A1 | | 10/2004 | Farrell et al. | |

(Continued)

FOREIGN PATENT DOCUMENTS

| | | |
|---|---|---|
| KR | 1020120028229 | 3/2012 |
| KR | 1020130128695 | 11/2013 |
| KR | 1020160140394 | 12/2016 |

*Primary Examiner* — Ajay Ojha

(57) ABSTRACT

A memory processing unit can be configured to compute partial products between one or more elements of a first matrix stored in a first storage location and sequential bits of one or more elements of a second matrix stored in a second storage location. The partial products can be calculated utilizing zero bit skipping to increase throughput and or reduce energy consumption. The partial products for each column of elements can be accumulated and bit shifted to compute the dot product of the first and second matrix.

17 Claims, 24 Drawing Sheets

(56) References Cited

U.S. PATENT DOCUMENTS

| | | |
|---|---|---|
| 2004/0230633 A1 | 11/2004 | Busada et al. |
| 2006/0212505 A1 | 9/2006 | Islam |
| 2010/0228923 A1 | 9/2010 | Lim |
| 2010/0308858 A1 | 12/2010 | Noda et al. |
| 2010/0332775 A1 | 12/2010 | Kapil et al. |
| 2013/0090907 A1 | 4/2013 | Maliassov |
| 2015/0085575 A1 | 3/2015 | Tam |
| 2017/0357891 A1 | 12/2017 | Judd et al. |
| 2018/0234653 A1 | 8/2018 | Meixner et al. |

* cited by examiner

MEMORY PROCESSING UNITS AND METHODS OF COMPUTING DOT PRODUCTS INCLUDING ZERO BIT SKIPPING

CROSS-REFERENCE TO RELATED APPLICATIONS

This application claims the benefit of U.S. Provisional Patent Application No. 62/844,644 filed May 7, 2019, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. In conventional computing systems, data is transferred from memory to one or more processing units, the processing units can perform calculations on the data, and the results are then transferred back to memory. The transfer of large amounts of data from memory to the processing unit and back to memory takes time and consumes power. Accordingly, there is a continuing need for improved computing systems that reduce processing latency, data transfer latency and or power consumption.

SUMMARY OF THE INVENTION

The present technology may best be understood by referring to the following description and accompanying drawings that are used to illustrate embodiments of the present technology directed toward memory processing units and methods of computing dot products including zero-bit skipping.

In one embodiment, a memory device can include a first storage location configured to store a set of multipliers, and a second storage location configured to store a set of multiplicands. Bit skipping logic can be configured to determine rows for a given bit position in a second storage location that hold non-zero values. One or more readout circuitry can be configured to sequentially bias rows of the first storage location corresponding to non-zero value rows for the given bit position in the second storage location. The one or more readout circuitry can also be configured to sequentially sense the rows of the first storage location, corresponding to the rows for the given bit position in the second storage location containing non-zero values, to determine partial products for the given bit position. One or more accumulators can be configured to accumulate the determined partial products for the given bit position. One or more shift registers can be configured to shift the accumulated values, after sequentially accumulating the determined partial products for the plurality of bit positions over the plurality of rows of the first storage location, as a matrix dot product of the set of multipliers and the set of multiplicands.

In another embodiment, a memory device can include a first storage location configured to store a set of multipliers, and a second storage location configured to store a set of multiplicands. Bit masking logic can be configured to sequentially access respective rows of the second storage location to determine if a given bit position of the given row in the second storage location is a non-zero value. The bit masking logic can also be configured to conditionally sequentially accessing rows of the first storage location corresponding to given rows in the second storage location when a given bit position of the given row in the second storage location is a non-zero value. Logic AND circuitry can be configured to conditionally bitwise AND the given bit position of the given row of the second storage location and the given row of the first storage location, when the given bit position of the given row in the second storage location is a non-zero value, to generate partial products for the given bit position. One or more accumulators can be configured to conditionally accumulate the partial products for the given bit position when the bit position of the given row in the second storage location is a non-zero value. The given bit position in the second storage location can be sequentially shifted in a predetermined direction and one or more shift registers can be configured to shift the accumulated value in a corresponding given direction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
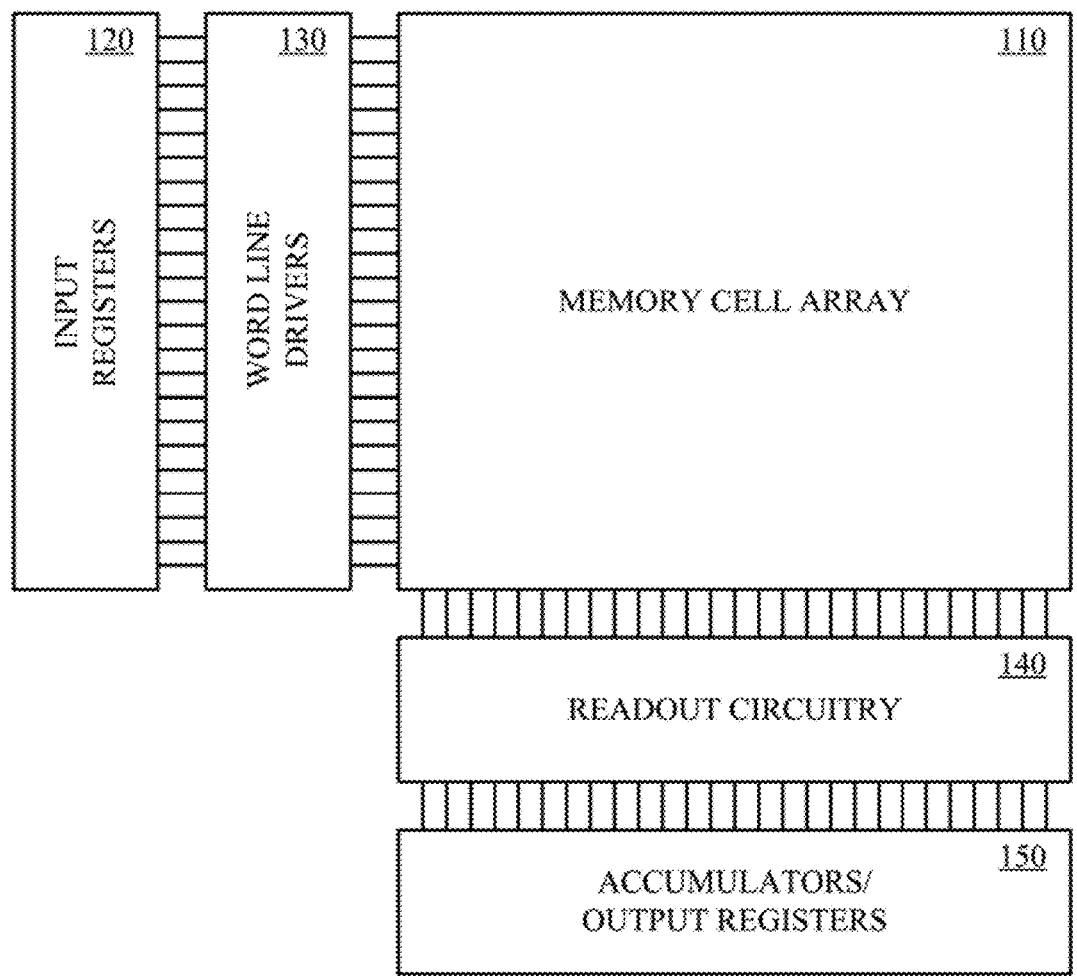
FIG. 1 shows a memory device, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Referring to FIG. 1, a memory device, in accordance with aspects of the present technology, is shown. The memory device 100 can include one or more memory cell arrays 110, input registers 120, word line drivers 130, readout circuitry 140, and accumulator/output registers 150. The memory device can also include other well-known circuits that are not necessary for an understanding of the present technology and therefore are not discussed herein.

Figure 2:
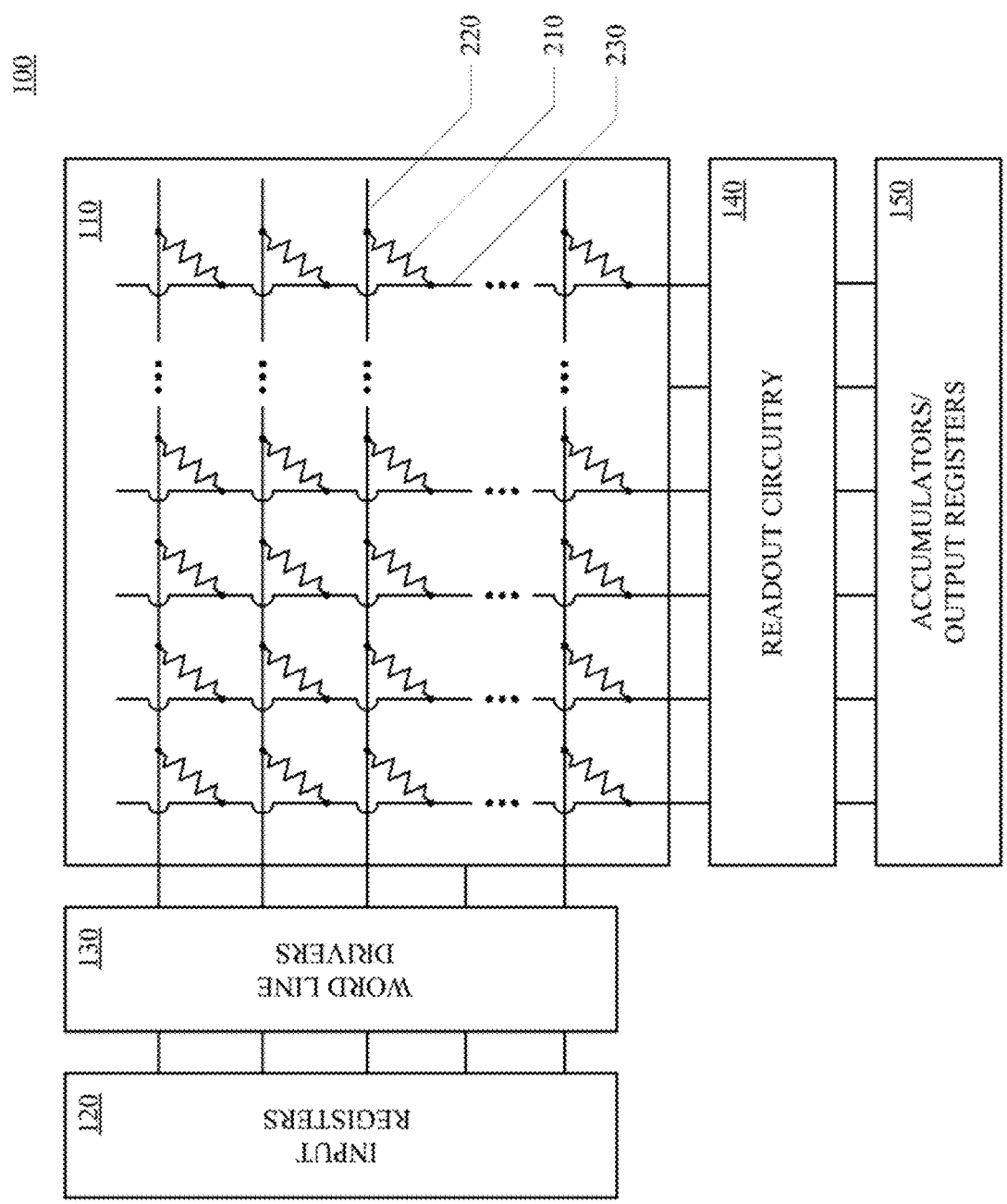
FIG. 2 shows a gateless cell architecture memory device, in accordance with aspects of the present technology.
Figure 3:
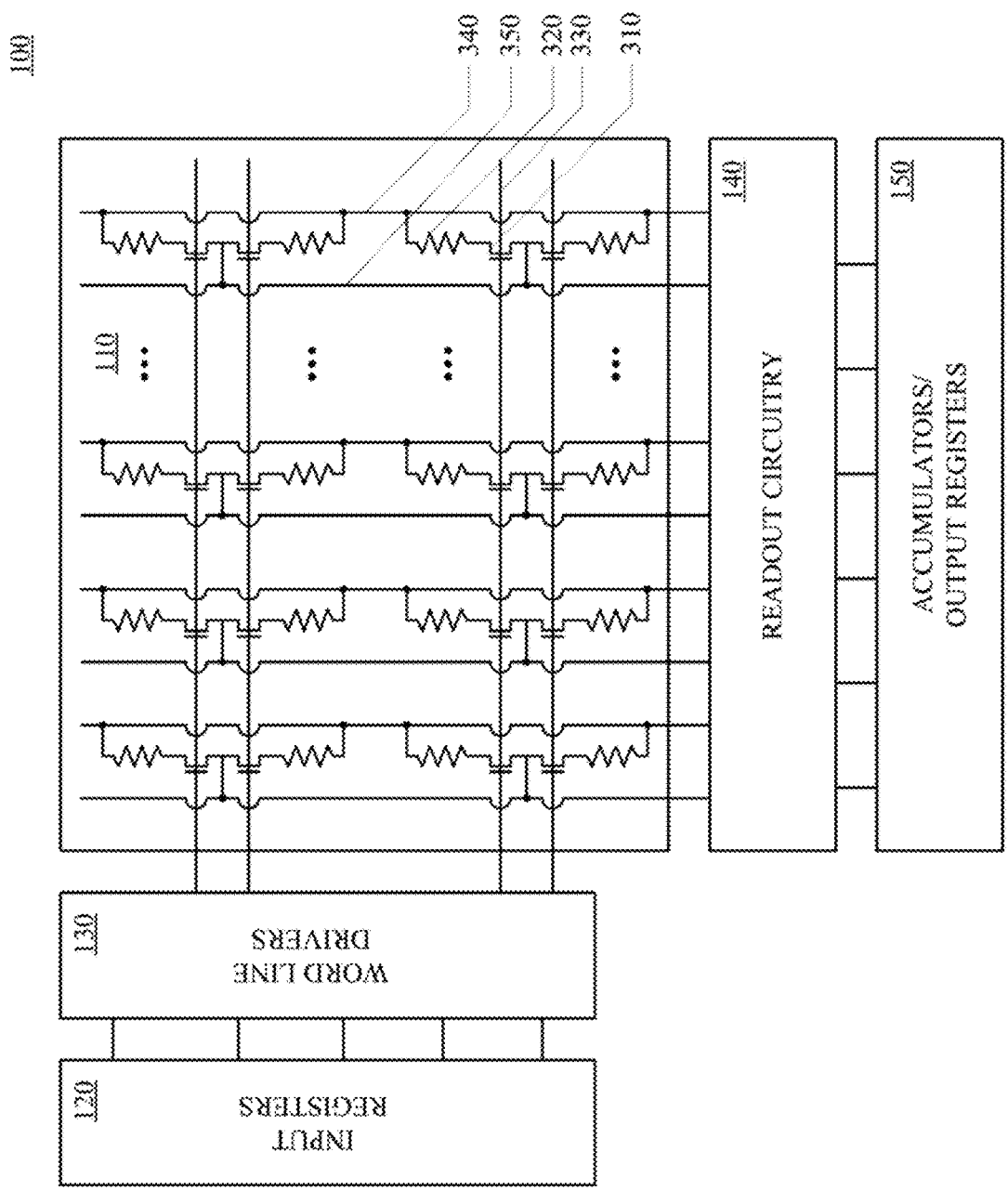
FIG. 3 shows a gated cell architecture memory device, in accordance with aspects of the present technology.

The one or more memory cell arrays 110 can be arranged in a plurality of rows of memory cells coupled to respective word lines and a plurality of columns of memory cells coupled to respective bit lines. The memory cells can be programmed to one of two states representing corresponding binary values of '0' and '1'. The memory cell array 110 can be of any number of different architectures. In one exemplary implementation, the memory cell array 110 can be comprised of single resistive memory cells, as illustrated in FIG. 2. Each resistive memory cell 210 can be coupled across a respective word line 220 and a respective bit line 230. In another exemplary implementation, each memory cell can be comprised of a transistor 310 and a resistive element 320, as illustrated in FIG. 3. The gate of the transistor 310 can be coupled to a respective word line 330. The resistive element 320 can be coupled between a respective bit line 340 and the source of the transistor 310. The drain of the transistor 310 can be coupled to a respective source line 350. In a resistive random access memory architecture, a '0' bit can be represented by a high-resistance state of the memory cell, and a '1' can be represented by a low-resistance state of the memory cell.

Referring again to FIG. 1, the memory device 100 can be configured to store data in accordance with conventional aspects of memory devices. For instance, the word line drivers 130 can drive a select word line of the array in accordance with a decoded memory address. The readout circuitry 140 can utilize the bit lines, or a combination of the bit lines and the source lines, to read from and write to memory cells of a selected word line of the array.

Figure 4:
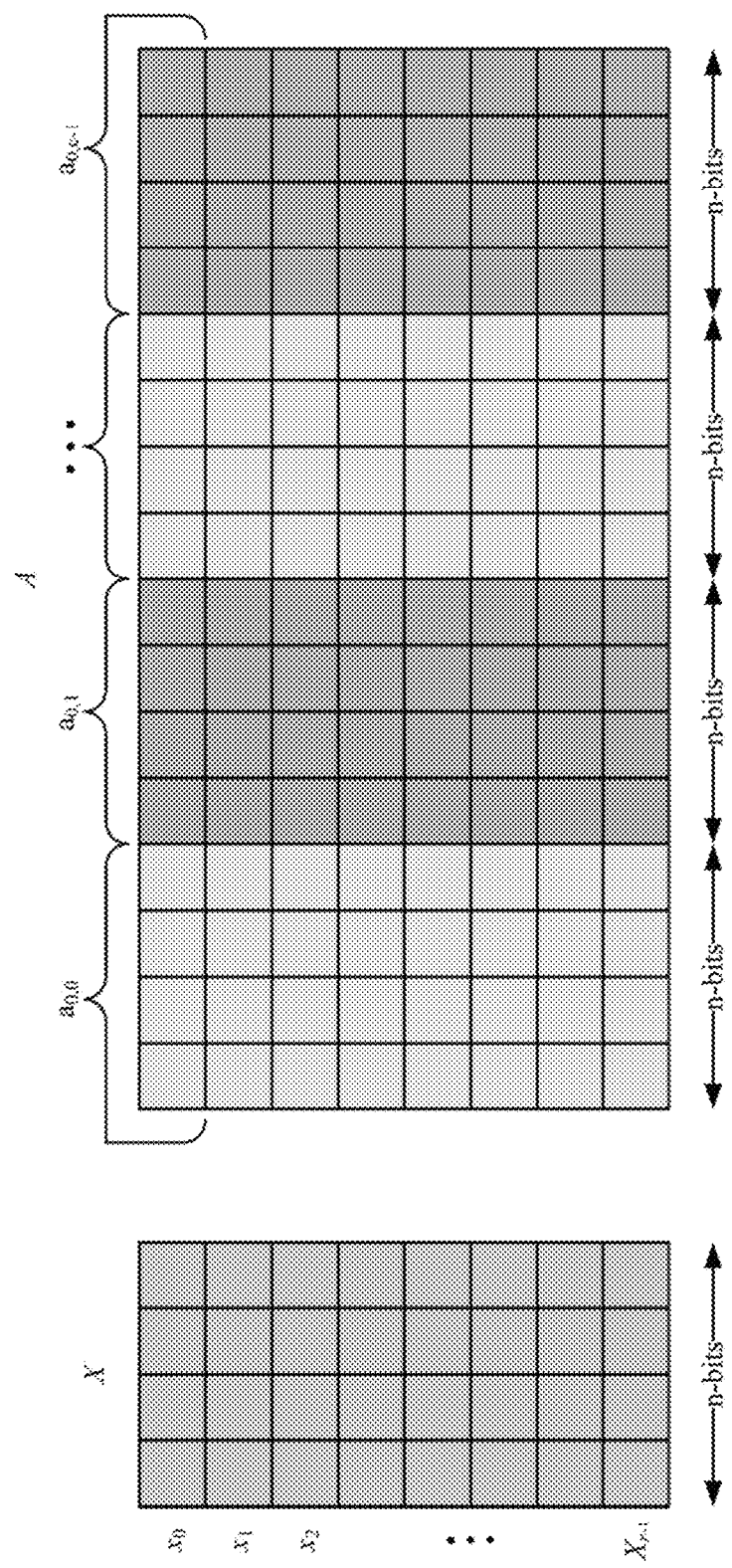
FIG. 4 illustrates an exemplary dot product, in accordance with aspects of the present technology.

The memory device 100 can also be configured to compute matrix dot products. Matrix dot products are used in artificial intelligence, big-data analysis, edge computing and the like. For use in computing matrix dot products, the accumulators and output registers 150 can be coupled to the readout circuitry 140. A first matrix A can be stored in the array of memory cells 110, and a second matrix X can be loaded into the input registers 120. Referring now to FIG. 4, an example of the first matrix A loaded in a portion of the array of memory cells 110, and the second matrix X loaded in the input registers is illustrated. In the example, the first matrix can include r rows and c columns of elements, the second matrix can include r rows and one column of elements. The elements can comprise values represented by n bits. In the example, as illustrated in FIG. 4, the element values can be 4-bit values. However, it is appreciated that the matrix elements can be of any predetermined number of bits. For example, in neural network applications, the matrix elements are commonly 8-bit values. Each row of the input registers can be associated with a corresponding word line. As illustrated in FIG. 4, the four bit value of the first element $x_0$ of the second matrix can be loaded into a first four bit register, the second element $x_1$ of the second matrix can be loaded into a second four bit register, and so on, with the last element $x_{n-1}$, of the second matrix loaded into a last four bit register. Similarly, a first element $a_{0,0}$ in a first row of the first matrix can be loaded into a first four bits of a first row of a group of memory cells, a second element $a_{0,1}$ in the first row of the matrix can be loaded into the next four bits of the first row of the group of memory cells, and so on, with the last element $a_{r-1,c-1}$ in a last row of the first matrix loaded into the last four bits in the last row of the group of memory cells. The matrix dot product can be computed by multiplying each element in the first column of the second matrix X with the corresponding element in the first column of the first matrix A and summing the partial products thereof, and repeating the process for each column of the first matrix A such that the elements in the first column of the second matrix X multiplied with the corresponding element in the last column of the first matrix A, and summing the partial products thereof.

Figure 5:
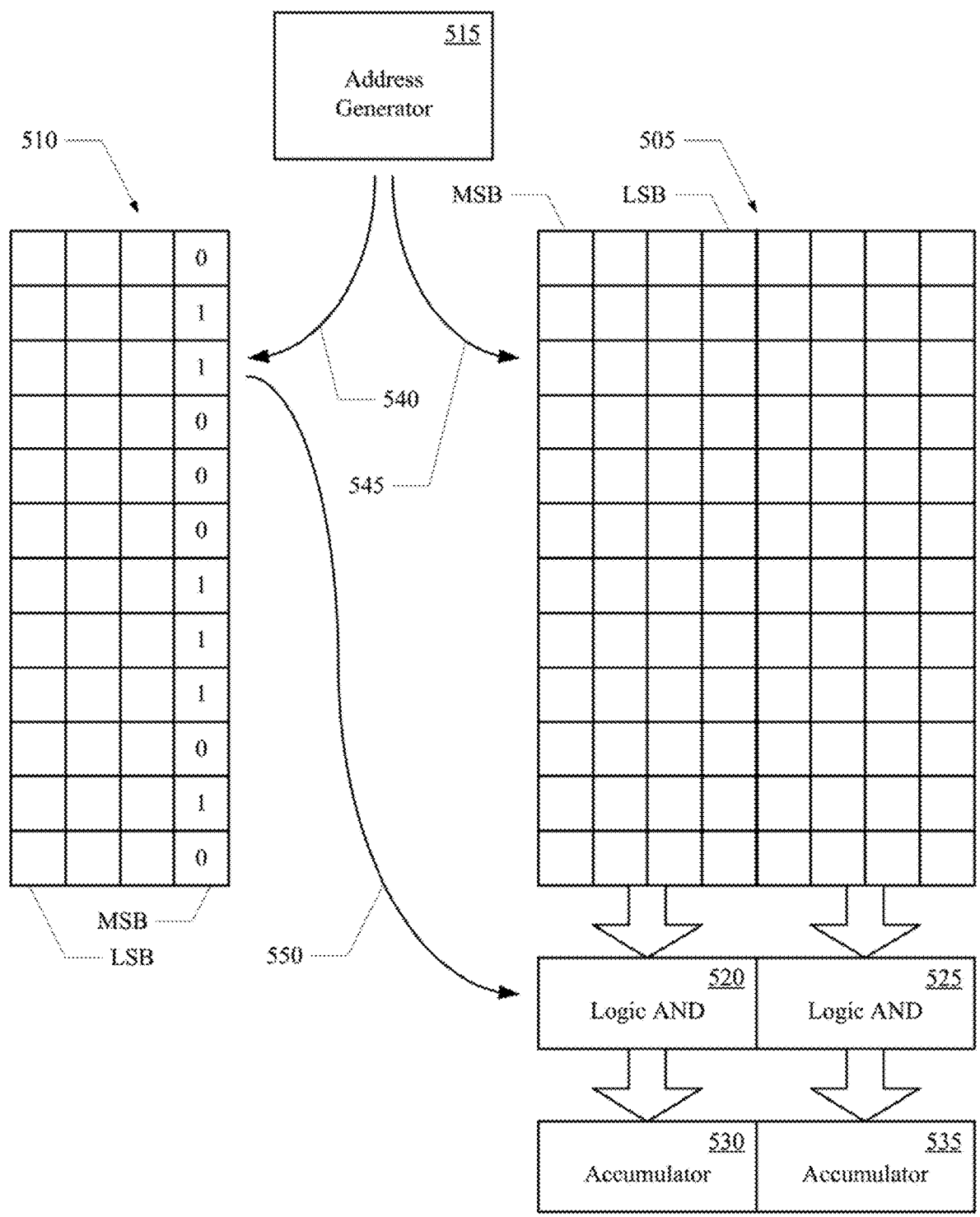
FIG. 5 shows a memory device configured to compute matrix dot products, in accordance with aspects of the present technology.

Referring now to FIG. 5, a memory device configured to compute matrix dot products, in accordance with aspects of the present technology, is shown. The memory device can include a first storage location 505, a second storage location 510, an address generator 515, Boolean logic AND circuitry 520, 525, and one or more accumulators 530, 535. The logic AND circuitry 520, 525 can be organized to work on a word of data. The one or more accumulators can be organized to work on matrix elements of n bits. As illustrated, the matrix elements can be four bits, more or less. For example, in machine learning, artificial intelligence, and similar applications, a matrix element is commonly eight bits or more.

Figure 6A:
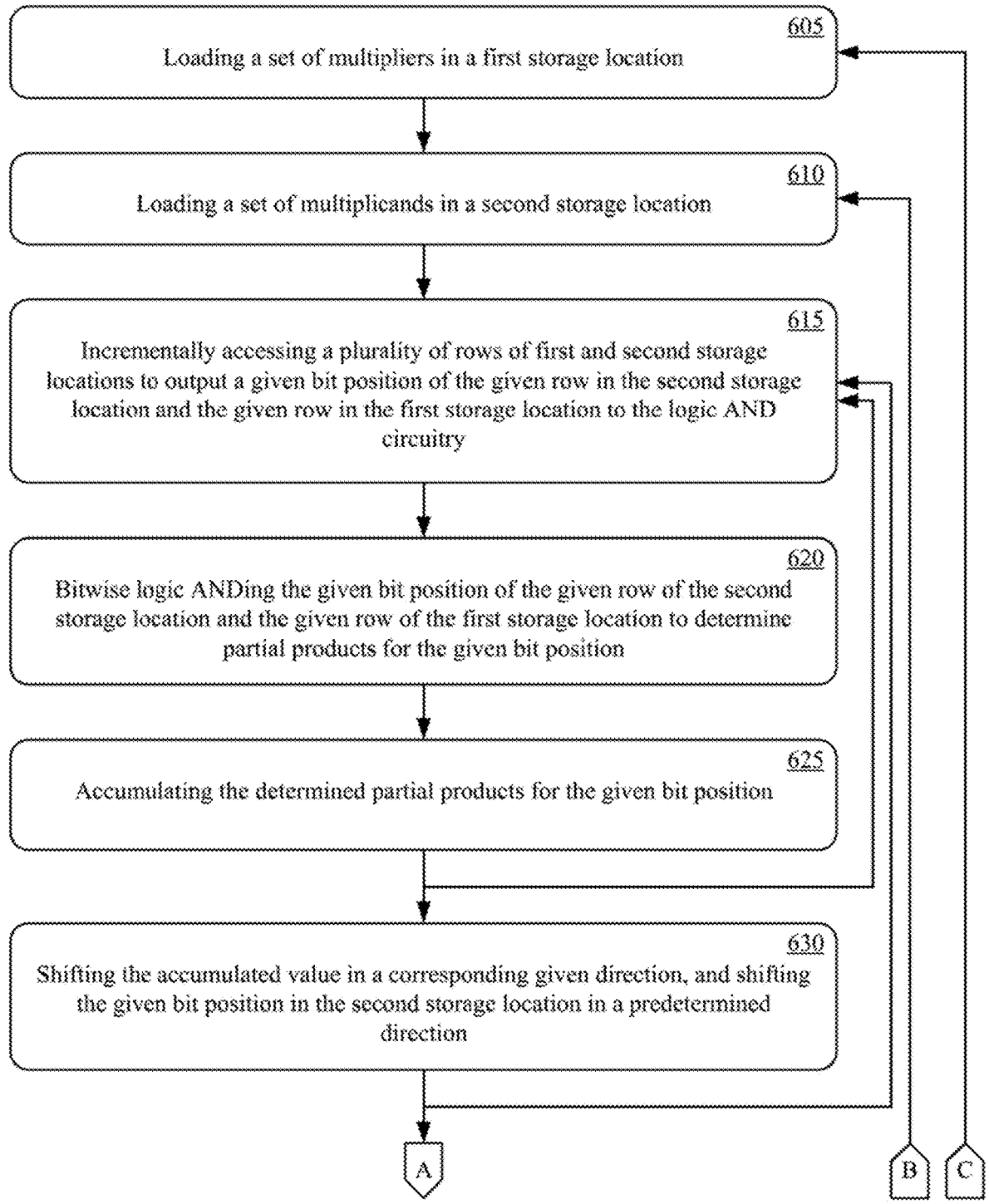
FIGS. 6A and 6B show method of computing a matrix dot product, in accordance with aspects of the present technology.
Figure 6B:
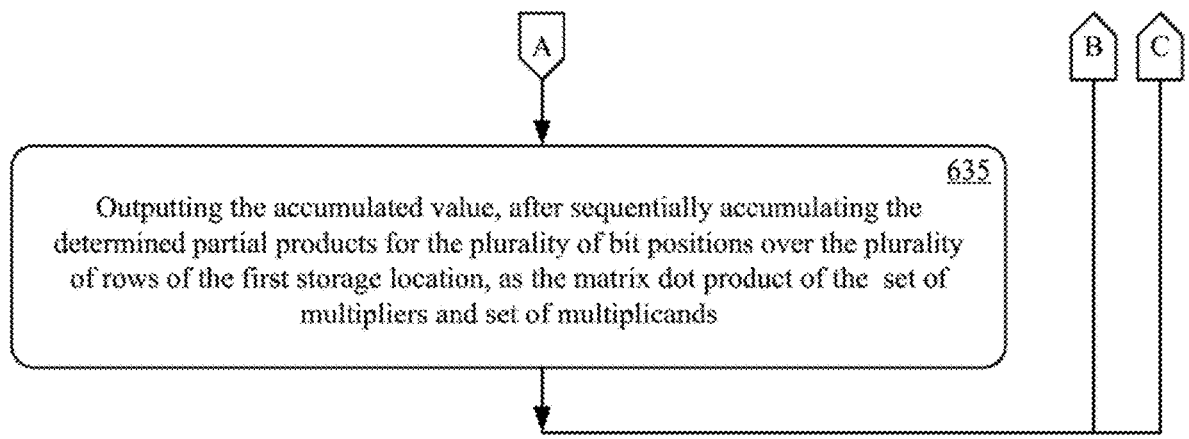

In one implementation, the first storage location 505 can be a resistive random access memory (RRAM), and the second storage location 510 can be a set of registers. In another implementation, the second storage location 510 can be a static random access memory (SRAM). The first storage location 505 can be configured to store a plurality of multipliers, and the second storage location 510 can be configured to store a plurality of multiplicands. For the purposes of describing aspects of the present technology, the most-significant-bit (MSB) of the multiplicands can be stored on the right, and the most-significant-bit (MSB) of the multipliers can be stored on the left, as illustrated in FIG. 5. The computation of matrix dot products will be further explained with reference to FIGS. 6A and 6B.

At 605, a set of multipliers can be loaded into the first storage location 505. At 610, a set of multiplicands can be loaded into the second storage location 510. At 615, a plurality of rows of the first and second storage locations can be incrementally accessed. In one implementation, the address generator 515 can be configured to send incrementing row addresses 540, 545 to the first storage location 505 and the second storage location 510. A given bit position of the given row in the second storage location 510 and the given row in the first storage location 505 can be output to the logic AND circuitry 520, 525. At 620, the logic AND circuitry 520, 525 can perform a bitwise AND of the given bit position of the given row of the second storage location 510 and the given row of the first set of storage locations 505. At 625, the accumulators 530, 535 can be configured to accumulate the output of the logic AND circuitry 520, 525 for the given bit position, and the processes of 615-625 can be repeated for the plurality of rows. After rows of the first and second storage locations 505, 510 are incrementally addressed by the address generator 515, the bit position in the second storage location 510 for input to the logic AND circuitry 520, 525 can be shifted by one bit to the left when processing from the most-significant-bit to the least-significant-bit, and the contents of the one or more accumulators 530, 535 can shifted one bit to the left, at 630. If processing from the least-significant-bit to the most-significant-bit, the bit position in the second storage location can be shifted by one bit to the right, and the contents of the one or more accumulators 530, 535 can be shifted one bit to the right. The processes at 615-630 can be repeated for each bit position of the second storage location 510. After the process at 615-630 are repeated for each bit position of the second storage location 510, the accumulated value in the one or more accumulators 530, 535 can be output as the matrix dot product of the set of multiplier and the set of multiplicands, at 635. In addition, the process can be repeated using a new multiplicand and the same multiplier by loading a new multiplicand in the second storage location, at 610 and repeating the processes at 615-635. Alternatively, new multipliers and multiplicands can be loaded at 605 and 610, and the processed at 615-635 can be repeated for the new multiplicand and multiplier values.

In other implementations, the MSB of the first and or second storage locations 505, 510 can be right or left aligned, and the content of the accumulators 530, 535 can be shifted right or left depending upon the alignment of the MSB of the first and second storage locations 505, 510.

Figure 7:
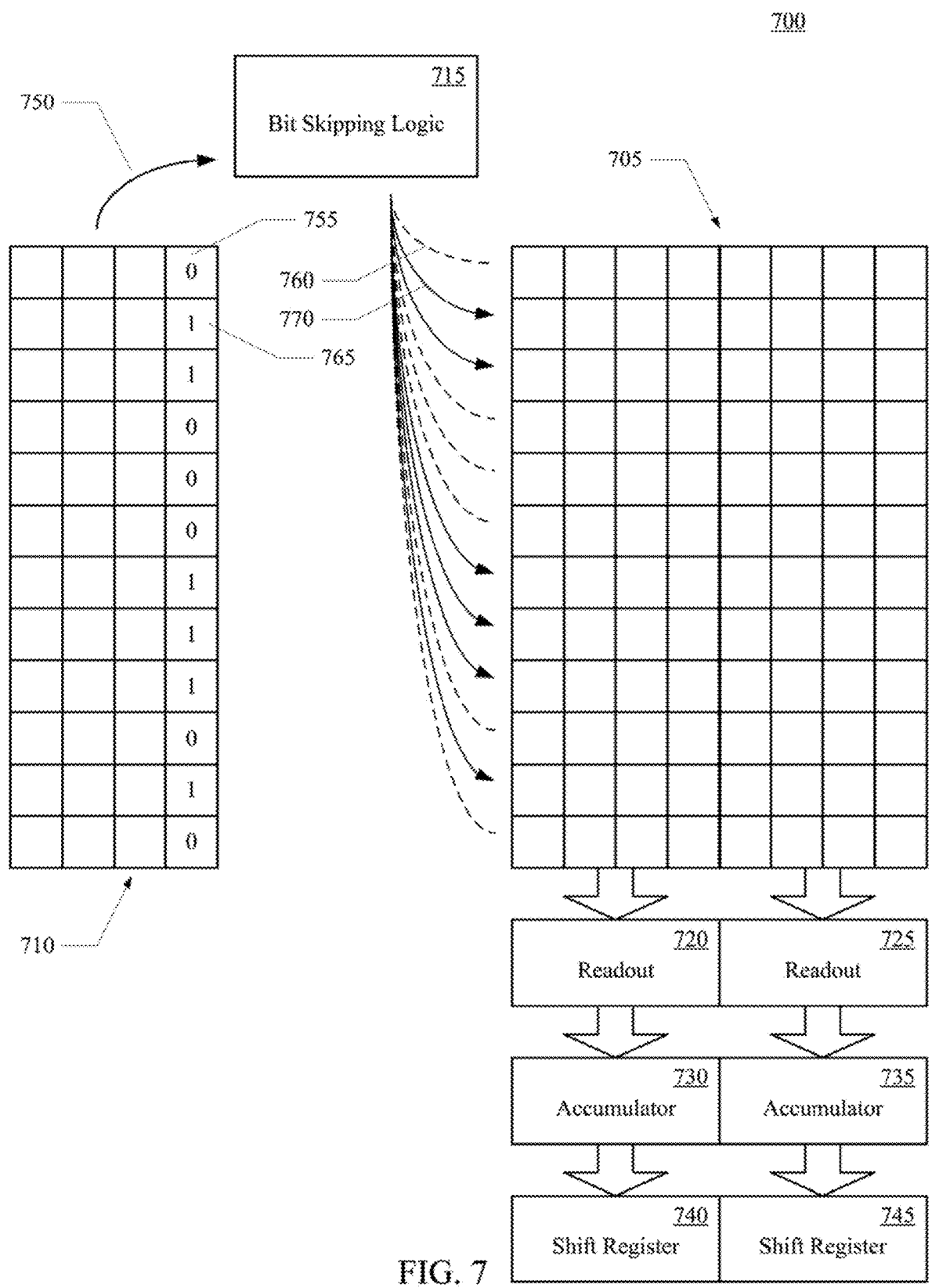
FIG. 7 shows a memory device configured to compute matrix dot products, in accordance with aspects of the present technology.
Figure 8A:
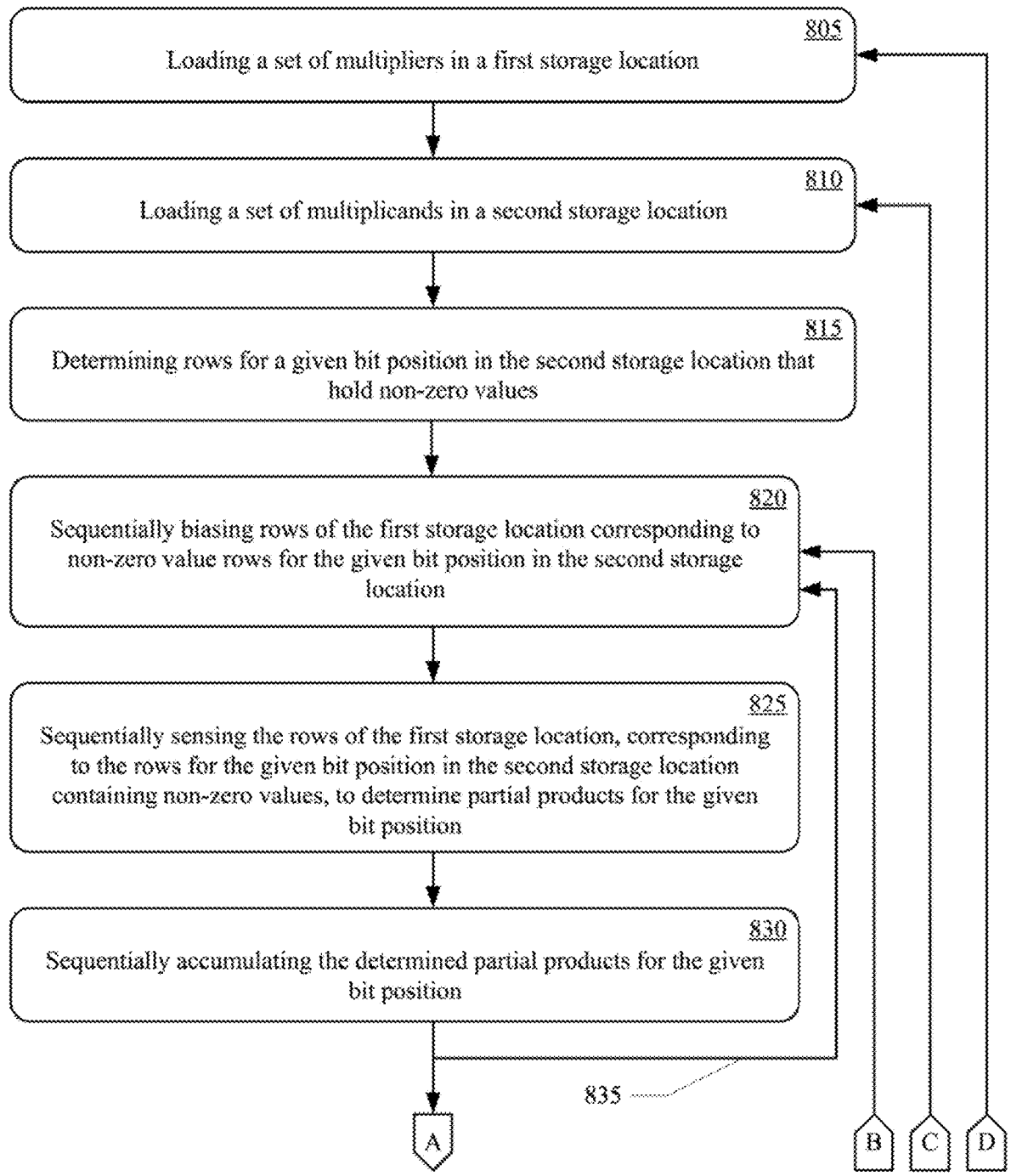
FIGS. 8A and 8B show method of computing a matrix dot product, in accordance with aspects of the present technology.
Figure 8B:
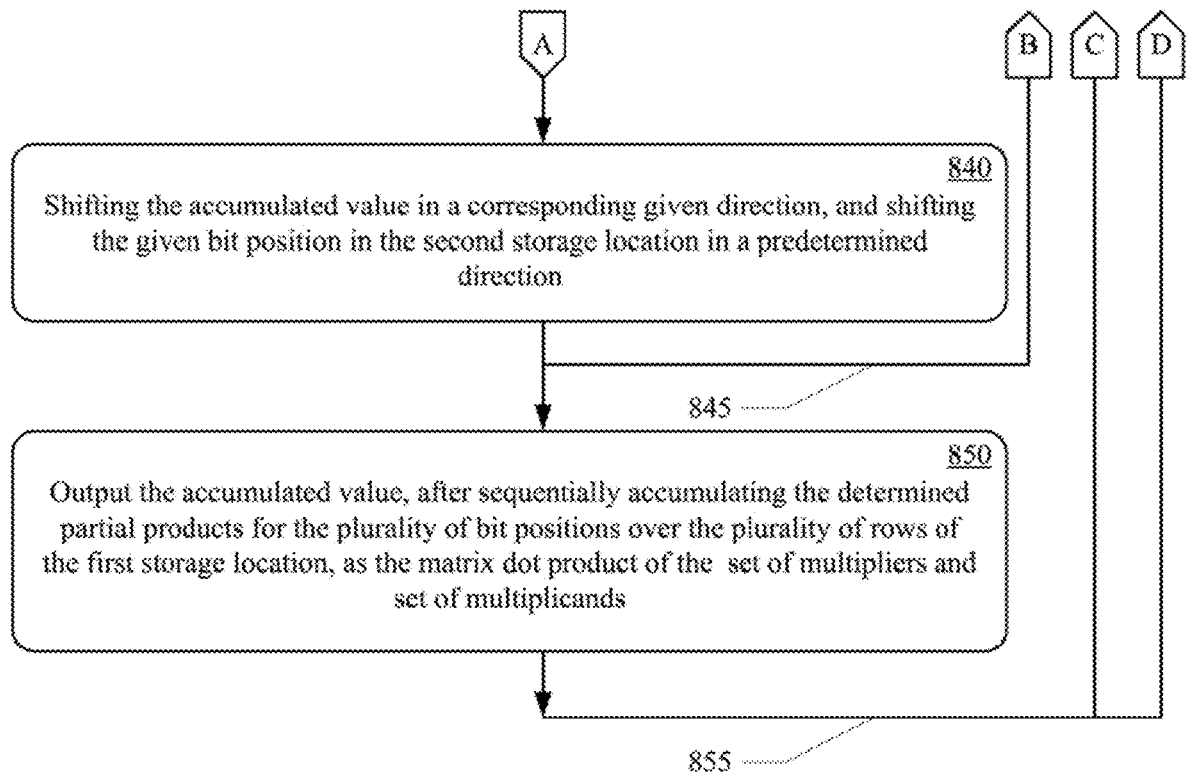

Referring now to FIG. 7, a memory device configured to compute matrix dot products, in accordance with aspects of the present technology, is shown. The memory device 700 can include a first storage location 705, a second storage location 710, bit skipping logic 715, one or more readout circuitry 720, 725, one or more accumulators 730, 735, and one or more shift registers 740, 745. In one implementation, the first storage location 705 can be a resistive random access memory (RRAM), and the second storage location 710 can be a set of registers. In another implementation, the second storage location 710 can be a static random access memory (SRAM). For purposes of explaining aspects of the present technology, the first and second storage locations 705, 710 are illustrated as storing respective matrices. However, more commonly, the first and second matrix are stored in respective portions of much larger first and second storage locations. The memory device configured to compute matrix dot products will be further explained with reference to FIGS. 8A and 8B.

To compute a matrix dot product, a set of multipliers can be loaded into the first storage location 705, at 805. In one implementation, a first matrix A of r rows and c columns of elements, wherein each element can be n-bits, can be loaded into the first storage location 705. A set of multiplicands can be loaded into the second storage location 710, at 810. In one implementation, a second matrix X of r n-bit element values can be loaded into the second storage location 710. In another implementation, the second storage location 710 can include r rows of single bit registers for storing a respective given bit of the r elements of matrix X. For purposes of explaining aspects of the present technology, as illustrated in FIG. 8, the first storage location 705 can store a 12×2 matrix, wherein each element is 4-bits, and the second storage location 710 can store a 12×1 matrix, wherein each element is 4-bits. However, the first and second storage locations 705, 710 can be configured to store any predetermined number of r rows of elements, and the first storage location 705 can be configured to store any predetermined number of c elements, wherein n-bit element values can be of any predetermined number of bits.

At 815, the bit skipping logic 715 can be configured to determine 750 rows for a given bit position in the second storage location 710 that hold non-zero values. For example, the bit skipping logic 715 can access the second storage location 710 to determine which rows for a most-significant-bit (MSB) contain bit values of '1.'

At 820, the bit skipping logic 715 can be configured to sequentially bias the rows of the first storage location 705 containing matrix A, that correspond to the rows in the second storage location 710 that hold non-zero values of the given bit position. For example, the most-significant-bit in the first row 755 in the second storage location 710 can be '0.' Therefore, the bit skipping logic 715 can skip 760 biasing the first row in the first storage location 705. The most-significant-bit in the second row 765 in the second storage location 710 can be '1.' Therefore, the bit skipping logic 715 can bias 770 the second row in the first storage location 705 with a word line read voltage potential. The bit skipping logic can sequentially bias each row in the first storage location 705 that corresponds to a row in the second storage location 710 that holds a '1' for the most-significant-bit.

At 825, the readout circuitry 720, 725 can be configured to sequentially sense the rows of the first storage location, that correspond to the rows in the second storage location 710 that hold non-zero bit values, to determine corresponding partial products. For example, the readout circuitry 720, 725 can be configured to sense bit values in the second row of the first storage location 705 when the second row is biased with a read word line potential 770, because the given bit in the second row 765 of the second storage location 710 holds a '1.' The bit values output by the readout circuitry 720, 725 represent a partial product.

At 830, the one or more accumulators 730, 735 can be configured to sequentially accumulate the partial products output by the readout circuitry 720, 725. The processes at 820-830 can be repeated, at 835, for each row of the second matrix X for the given bit position. Accordingly, the bit skipping logic 715 can repeat biasing each row in the first storage location 705 for each bit position in the second storage location 710 that is a non-zero value. The readout circuitry 720, 725 can also repeat sensing the rows of the first storage location, that correspond to the rows in the second storage location that hold non-zero-bit values for a given significant bit, to determine corresponding partial products. In addition, the one or more accumulators 730, 735 can repeat accumulating the partial products output by the readout circuitry 720, 725.

Probabilistically, approximately half of the bits of the multiplicand will be '0' and half will be '1'. Multiplication by a '0' value multiplicand is always '0' regardless of the multiplier. Therefore, energy consumption can be reduced and or computation throughput can be increased if '0' multiplicand values are skipped. In conventional bit skipping methods, the computation of a given multiplicand and a given multiplier can be skipped if all the bits of the given multiplicand are zero. In contrast, aspects of the present technology perform the computation on a bit-serial basis, and therefore bit skipping can be applied for each bit position of a given multiplicand that is zero. Accordingly, the bit skipping of each zero bit value in the second matrix X in the second storage location 710 is more effective than the conventional art, which requires all bits in a given multiplicand to be zero.

At 840, the one or more shift register 740, 745 can be configured to shift the accumulated value from the respective one or more accumulators 730, 735 in a first predetermine direction after the rows in the first storage location 705 corresponding to non-zero values in the second storage location 710 for a given bit position have been accumulated. The bit shifted accumulated value can then be loaded back into the corresponding accumulators 730, 735. The given bit position in the second storage location 710 can also be shifted in a second predetermined direction, at 840. In one implementation, when sequencing through the multiplicand from the most-significant-bit to the least-significant-bit, the accumulated value from the respective one or more accumulators 730, 735 can be shifted one bit to the left and then loaded back into the corresponding accumulators 730, 735. In addition, the given bit position in the second storage location 710 can be shifted one bit to the left. If processing from the least-significant-bit to the most-significant-bit, the bit position in the second storage location can be shifted by one bit to the right, and the contents of the one or more accumulators 730, 735 can be shifted one bit to the right. The processes at 820-840 can be repeated 845 for each bit position. For example, after sequentially biasing rows of the first storage location, sequentially sensing the rows in the first storage location and sequential accumulating the partial products for the most-significant-bit in the plurality of rows in the second storage location, the process can be repeated for the next most-significant-bit, and so on until the least-significant-bit is also processed.

At 850, the accumulated value can be output after sequentially accumulating the determined partial products for the plurality of bit positions over the plurality of rows of the first storage location. The accumulated value can be output as the matrix dot product of the multipliers of the first matrix A and the multiplicands of the second matrix X. In one implementation, the accumulated value can be output for storage in the first or second storage location, to be used for example in another vector dot product calculation.

At 855, the processes at 810-850 can be repeated to calculate another dot product utilizing the same first matrix A and a new instance of the second matrix X, wherein the new instance of the second matrix X is loaded into the second storage location at 810. Accordingly, the first matrix A can be reused to calculate dot products for multiple instances of the second matrix X. Alternative, the processes at 805-850 can be repeated, at 855, to calculate another dot product utilizing new instances of the first matrix A and new instances of the second matrix X.

Aspects of the present technology can advantageously increase throughput of vector dot products as a result of skipping each zero bit value in each multiplicand. Aspects of the present technology can also advantageously reduce energy consumption as a result of skipping each zero bit value in each multiplicand.

Figure 9A:
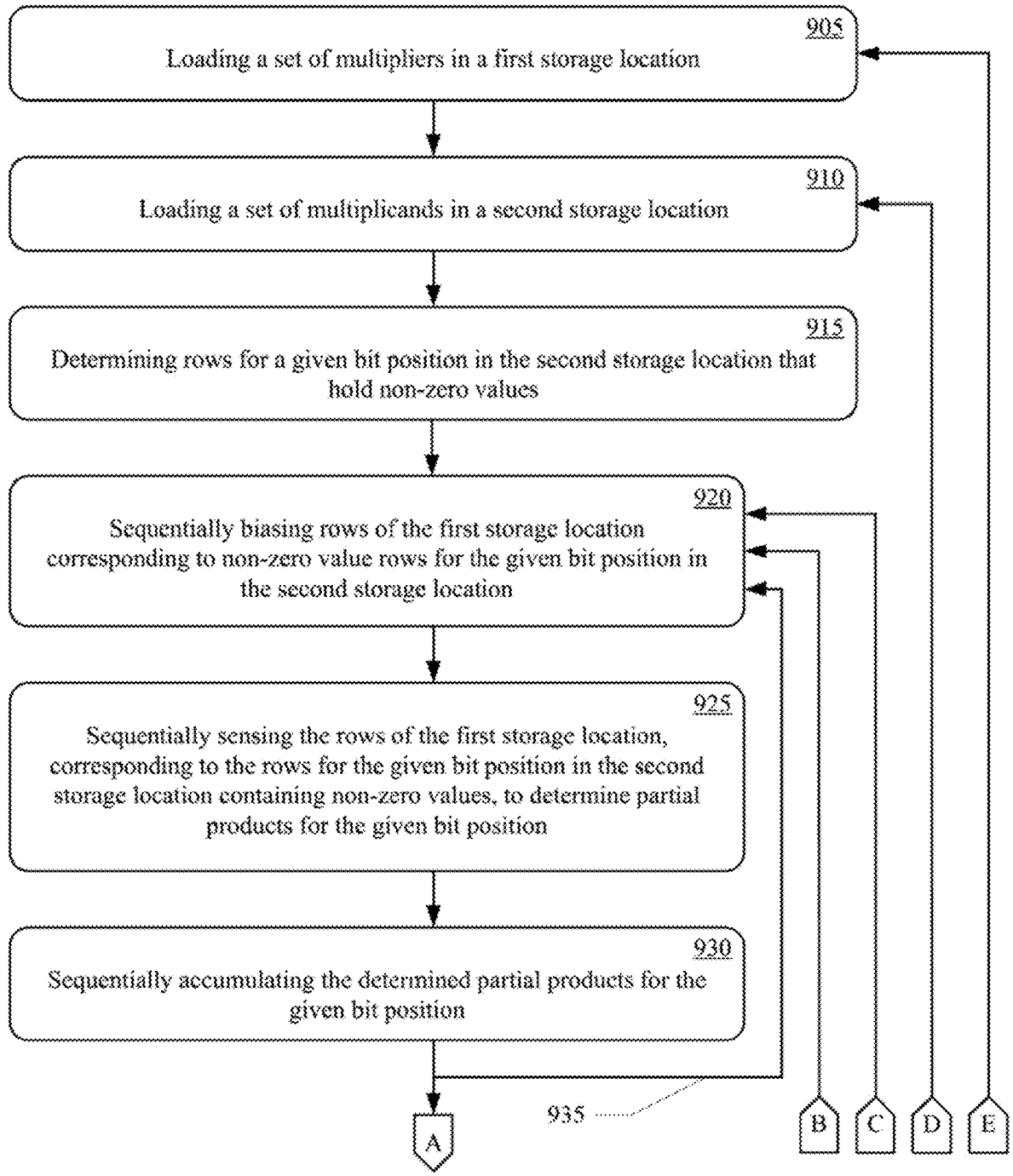
FIGS. 9A and 9B show method of computing a matrix dot product, in accordance with aspects of the present technology.
Figure 9B:
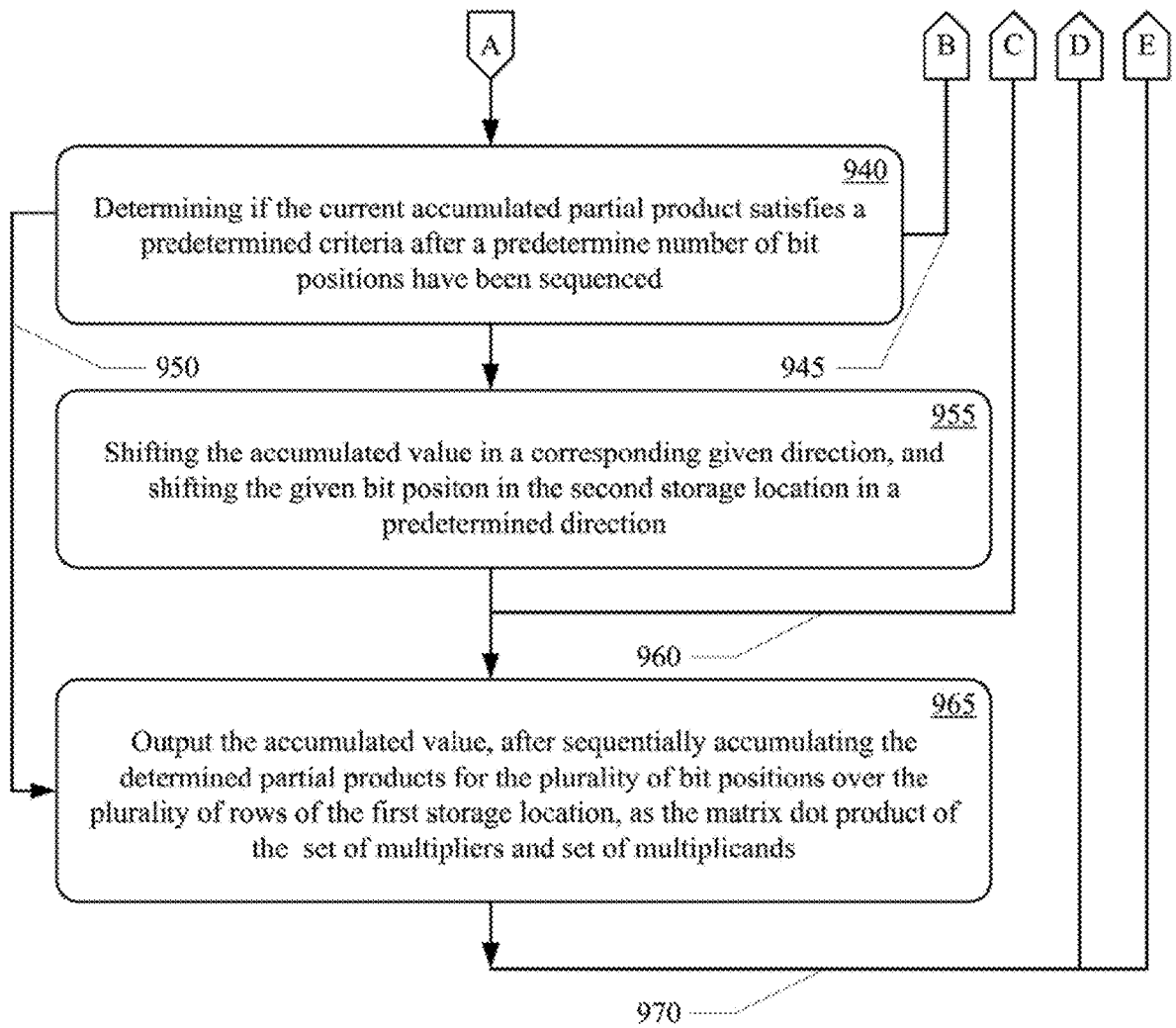

Referring now to FIGS. 9A and 9B, a method of calculating a vector dot product, in accordance with aspects of the present technology, is shown. At 905, a set of multipliers can be loaded into a first storage location 705. In one implementation, a first matrix A of r rows and c columns of elements, wherein each element can be n-bits, can be loaded into the first storage location 705. A set of multiplicands can be loaded into the second storage location 710, at 910. In one implementation, a second matrix X of r n-bit element values can be loaded into the second storage location 710. In another implementation, the second storage location 720 can include r rows of single bit registers for storing a respective given bit of the r elements of matrix X.

At 915, the bit skipping logic 715 can be configured to determine 750 rows for a given bit position in the second storage location that hold non-zero values. For example, the bit skipping logic 715 can access the second storage location 710 to determine which rows for a most-significant-bit (MSB) contain bit values of '1.'

At 920, the bit skipping logic 715 can be configured to sequentially bias the rows of the first storage location 705 containing matrix A, which correspond to the rows in the second storage location 710 that hold non-zero values for the given bit position. For example, the most-significant-bit in the first row 755 in the second storage location 710 can be '0.' Therefore, the bit skipping logic 715 can skip 760 biasing the first row in the first storage location 705. The corresponding rows in the first storage location 710 can be skipped because multiplication of any value by '0' results in a '0' for the corresponding row. In contrast, the most-significant-bit in the second row 765 in the second storage location 710 can be '1.' Therefore, the bit skipping logic 715 can bias 770 the second row in the first storage location 705 with a word line read voltage potential. The bit skipping logic can sequentially bias each row in the first storage location 705 that corresponds to a row in the second storage location 710 that holds a '1' for the most-significant-bit.

At 925, the readout circuitry 720, 725 can be configured to sequentially sense the rows of the first storage location, that correspond to the rows in the second storage location 710 that hold non-zero bit values, to determine corresponding partial products for the given bit position. For example, the readout circuitry 720, 725 can be configured to sense bit values in the second row of the first storage location 705 when the second row is biased with a read word line potential 770 because the given bit in the second row 765 of the second storage location 710 holds a '1.'

At 930, the one or more accumulators 730, 735 can be configured to sequentially accumulate the partial products output by the readout circuitry 720, 725. The processes at 920-930 can be repeated, at 935, for each row of the second matrix X for the given bit position. At 940, it can be determined if the current accumulated partial product satisfies a predetermined criteria after a predetermined number of bit positions have been sequenced. For example, to implement a rectified linear unit (ReLU) function, it can be determined if the current accumulated partial product of the plurality of rows is less than zero after m significant bits of the n bits. Generally, if the current accumulated partial product is less than zero after a predetermined number of most-significant-bits have been processed there can be a relatively low probability that the remaining least-significant-bits will result in an accumulated partial product that is greater than zero. If the predetermined number of bit positions have not been processed or the current accumulated partial product satisfies the predetermined criteria, the processes at 920-940 can be repeated, at 945, for the given bit position of the rows of the second matrix X. Accordingly, the bit skipping logic 715 can repeat biasing each row in the first storage location 705 for each bit position in the second storage location 710. The readout circuitry 720, 725 can also repeat sensing the rows of the first storage location, that correspond to the rows in the second storage location that hold non-zero-bit values, to determine corresponding partial products for a given bit position. In addition, the one or more accumulators 730, 735 can repeat accumulating the partial products output by the readout circuitry 720, 725. If the predetermined number of bit positions have been processed and the current accumulated partial product does not satisfy the predetermined criteria, the process can proceed at 950 to process 965 as described below. For example, if the current accumulated partial product is less than zero after m of the n bits have been processed, the calculation of the vector dot product can be terminated early. When calculation of the vector dot product is terminated early at 950 the number of biasing 920, sensing 925 and accumulating 930 operations are reduced.

At 955, the one or more shift register 740, 745 can be configured to shift the accumulated value in a first predetermined direction after the rows in the first storage location 705 corresponding to non-zero values in the second storage location 710 for a given bit position have been accumulated. The bit shifted accumulated value can then be loaded back into the corresponding accumulators 730, 735. The given bit position in the second storage location 710 can also be shifted in a second predetermined direction, at 955. In one implementation, when sequencing through the multiplicand from the most-significant-bit toward the least-significant-bit, the accumulated value from the respective one or more accumulators 730, 735 can be shifted one bit to the left and then loaded back into the corresponding accumulators 730, 735. In addition, the given bit position in the second storage location 710 can be shifted one bit to the left. If processing from the least-significant-bit to the most-significant-bit, the bit position in the second storage location can be shifted by one bit to the right, and the contents of the one or more accumulators 730, 735 can be shifted one bit to the right. The processes at 920-955 can be repeated 960 for each bit position. For example, after sequentially biasing rows of the first storage location, sequentially sensing the rows in the first storage location and sequential accumulating the partial products for the most-significant-bit in the plurality of rows in the second storage location, the process can be repeated for the next most-significant-bit, and so on until the least-significant-bit is also processed.

At 965, the accumulated value can be output after sequentially accumulating the determined partial products for the plurality of bit positions over the plurality of rows of the first storage location. The accumulated value can be output as the matrix dot product of the multipliers of the first matrix A and the multiplicands of the second matrix X. In one implementation, the accumulated value can be output for storage in the first or second storage location, to be used for example in another vector dot product calculation.

At 970, the processes at 910-965 can be repeated to calculate another dot product utilizing the same first matrix A and a new instance of the second matrix X, wherein the new instance of the second matrix X is loaded into the second storage location at 910. Accordingly, the first matrix A can be reused to calculate dot products for multiple instances of the second matrix X. Alternative, the processes at 905-965 can be repeated, at 970, to calculate another dot product utilizing new instances of the first matrix A and new instances of the second matrix X.

Early termination, when the current accumulated partial product does not satisfy a predetermined criteria after a predetermined number of bit positions have been sequenced, can advantageously be combined with zero bit skipping to advantageously further increase throughput of vector dot products. Early termination can also be advantageously combined with zero bit skipping to advantageously further reduce energy consumption.

Figure 10A:
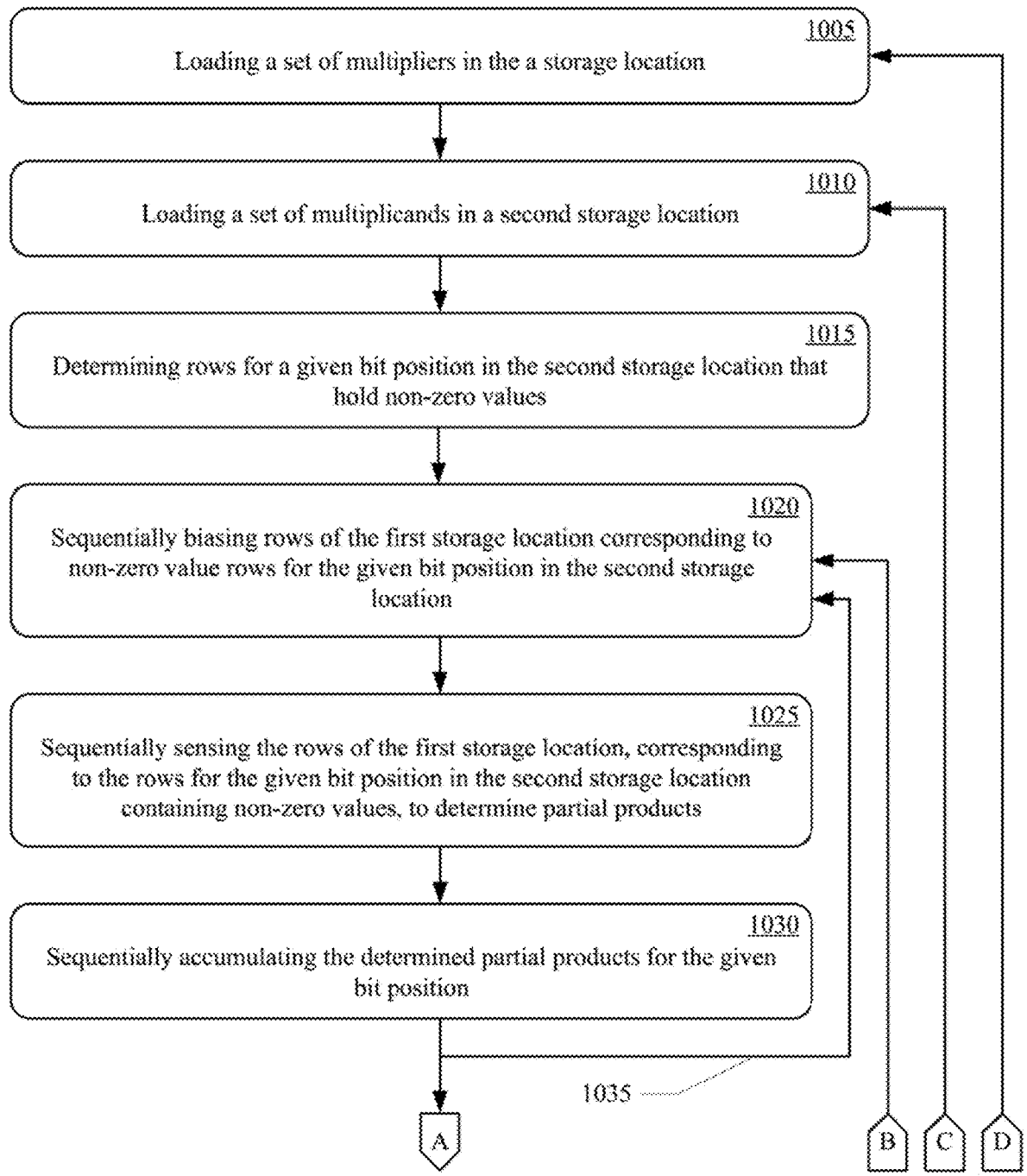
FIGS. 10A and 10B show method of computing a matrix dot product, in accordance with aspects of the present technology.
Figure 10B:
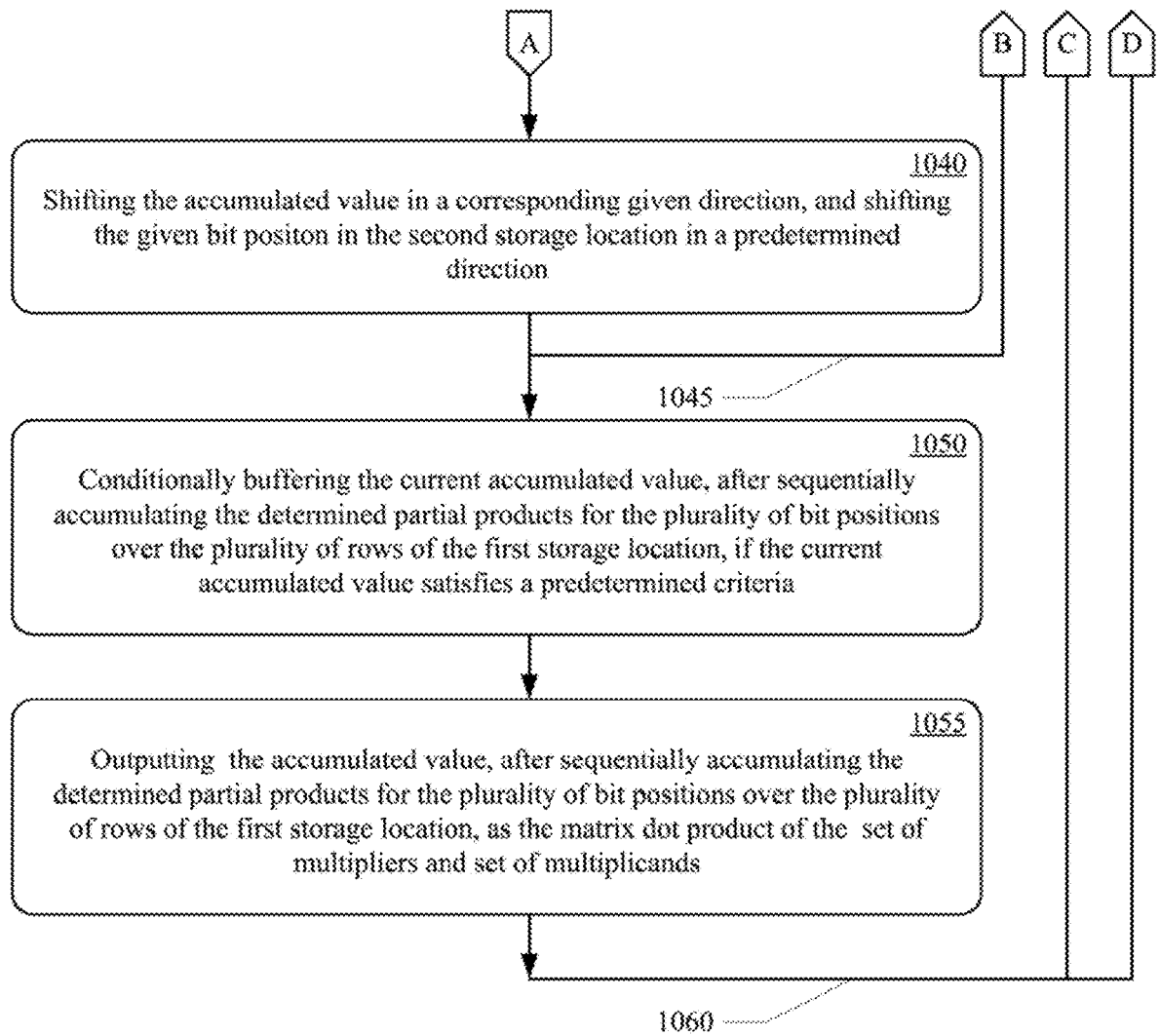

Referring now to FIGS. 10A and 10B, a method of calculating a matrix dot product, in accordance with aspects of the present technology, is shown. At 1005, a set of multipliers can be loaded into the first storage location 705. In one implementation, a first matrix A of r rows and c columns of elements, wherein each element can be n-bits, can be loaded into the first storage location 705. A set of multiplicands can be loaded into the second storage location 710, at 1010. In one implementation, a second matrix X of r n-bit element values can be loaded into the second storage location 710. In another implementation, the second storage location 710 can include r rows of single bit registers for storing a respective given bit of the r elements of matrix X.

At 1015, the bit skipping logic 715 can be configured to determine 750 rows for a given bit position in the second storage location that hold non-zero values. For example, the bit skipping logic 715 can access the second storage location 710 to determine which rows for a most-significant-bit (MSB) contain bit values of '1.'

At 1020, the bit skipping logic 715 can be configured to sequentially bias the rows of the first storage location 705 containing matrix A, which correspond to the rows in the second storage location 710 that hold non-zero values of the given bit position. For example, the most-significant-bit in the first row 755 in the second storage location 710 can be '0.' Therefore, the bit skipping logic 715 can skip 760 biasing the first row in the first storage location 705. The most-significant-bit in the second row 765 in the second storage location 710 can be '1.' Therefore, the bit skipping logic 715 can bias 770 the second row in the first storage location 705 with a word line read voltage potential. The bit skipping logic can sequentially bias each row in the first storage location 705 that corresponds to rows in the second storage location 710 that holds a '1'.

At 1025, the readout circuitry 720, 725 can be configured to sequentially sense the rows of the first storage location 705, that correspond to the rows in the second storage location 710 that hold non-zero bit values, to determine corresponding partial products. For example, the readout circuitry 720, 725 can be configured to sense bit values in the second row of the first storage location 705 when the second row is biased with a read word line potential 770 because the given bit in the second row 765 of the second storage location 710 holds a '1.'

At 1030, the one or more accumulators 730, 735 can be configured to sequentially accumulate the partial products output by the readout circuitry 720, 725. The processes at 1020-1030 can be repeated, at 1035, for each row of the second matrix X for the given bit position. Accordingly, the bit skipping logic 715 can repeat biasing each row in the first storage location 705 for each bit position in the second storage location 710 for a given significant bit. The readout circuitry 720, 725 can also repeat sensing the rows of the first storage location, that correspond to the rows in the second storage location that hold non-zero-bit values for a given bit position, to determine corresponding partial products. In addition, the one or more accumulators 730, 735 can repeat accumulating the partial products output by the readout circuitry 720, 725.

At 1040, the one or more shift register 740, 745 can be configured to shift the accumulated value from the respective one or more accumulators 730, 735 in a first predetermine direction after the rows in the first storage location 705 corresponding to non-zero values in the second storage location 710 for a given bit position have been accumulated. The bit shifted accumulated value can then be loaded back into the corresponding accumulators 730, 735. The given bit position in the second storage location 710 can also be shifted in a second predetermined direction, at 1040. In one implementation, when sequencing through the multiplicand from the most-significant-bit to the least-significant-bit, the accumulated value from the respective one or more accumulators 730, 735 can be shifted one bit to the left and then loaded back into the corresponding accumulators 730, 735. In addition, the given bit position in the second storage location can be shifted one bit to the left. If processing from the least-significant-bit to the most-significant-bit, the bit position in the second storage location can be shifted by one bit to the right, and the contents of the one or more accumulators 730, 735 can be shifted one bit to the right. The processes at 1020-1040 can be repeated 1045 for each bit position. For example, after sequentially biasing rows of the first storage location, sequentially sensing the rows in the first storage location and sequential accumulating the partial products for the most-significant-bit in the plurality of rows in the second storage location, the process can be repeated for the next most-significant-bit, and so on until the least-significant-bit is also processed.

At 1050, the accumulated value can be buffered, after sequentially accumulating the determined partial products for the plurality of bit positions over the plurality of rows of the first storage location, if the current accumulated value satisfies a predetermined criteria. For example, the present accumulated value can be buffered if greater than the current buffered accumulated value to implement a max pooling operation. The conditional output buffering can advantageously reduce output bandwidth and or downstream memory access bandwidth. In another example, output buffering can also act as a pipeline stage to improve timing.

At 1055, the accumulated value can be output after sequentially accumulating the determined partial products for the plurality of bit positions over the plurality of rows of the first storage location. The accumulated value can be output as the matrix dot product of the multipliers of the first matrix A and the multiplicands of the second matrix X. In one implementation, the accumulated value can be output for storage in the first or second storage location, to be used for example in another vector dot product calculation.

At 1060, the processes at 1010-1055 can be repeated, at 1060, to calculate another dot product utilizing the same first matrix A and a new instance of the second matrix X, wherein the new instance of the second matrix X is loaded into the second storage location at 1010. Accordingly, the first matrix A can be reused to calculate dot products for multiple instance of the second matrix X. Alternatively, the processes at 1005-1055 can be repeated, at 1060, to calculate another dot product utilizing new instances of the first matrix A and new instance of the second matrix X.

In additional embodiments, the early termination processes described above with reference to FIGS. 9A and 9B and the accumulated value buffer described above with reference to FIGS. 10A and 10B can be combined with the zero bit skipping processes.

Figure 11:
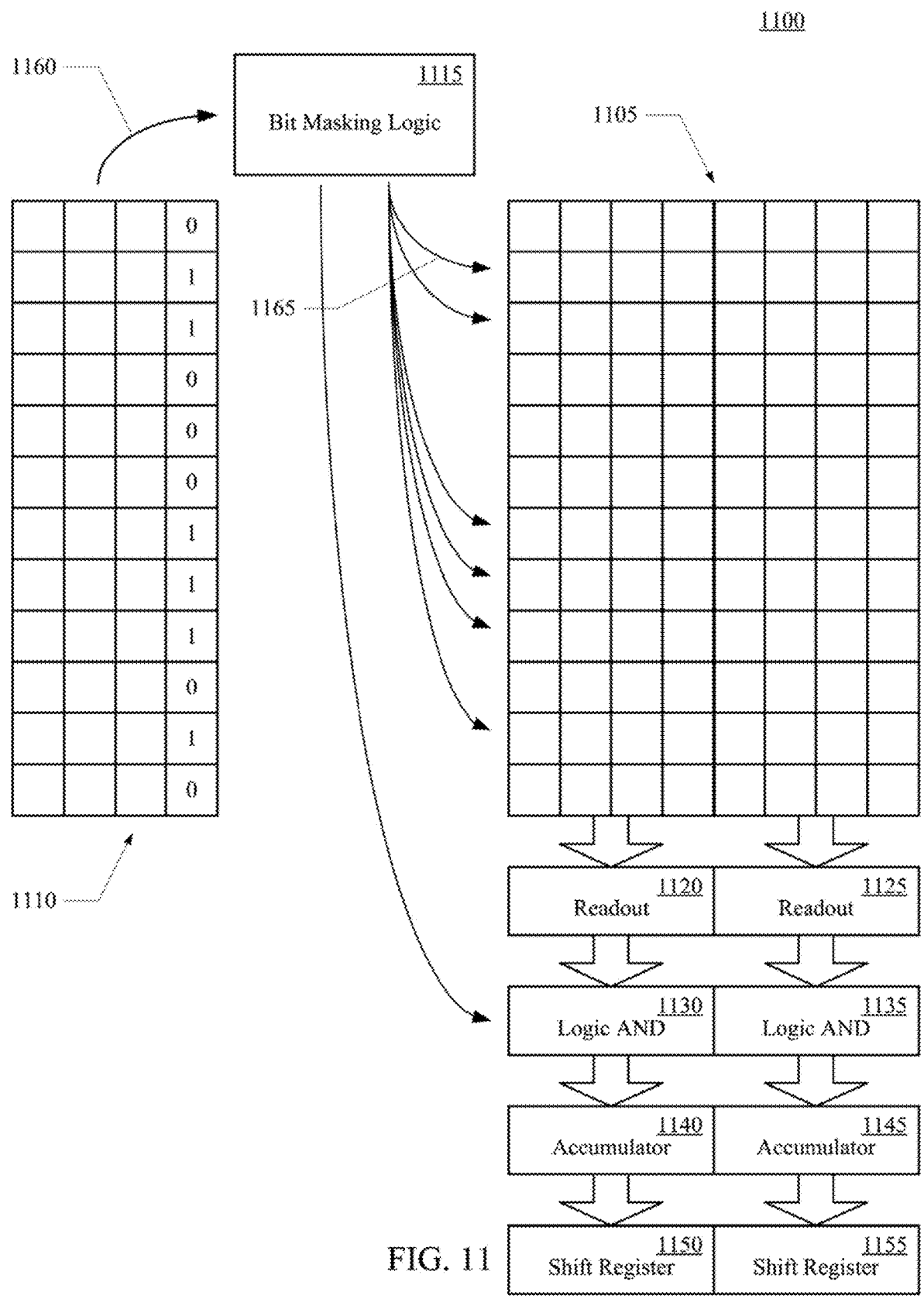
FIG. 11 shows a memory device configured to compute matrix dot products, in accordance with aspects of the present technology.
Figure 12A:
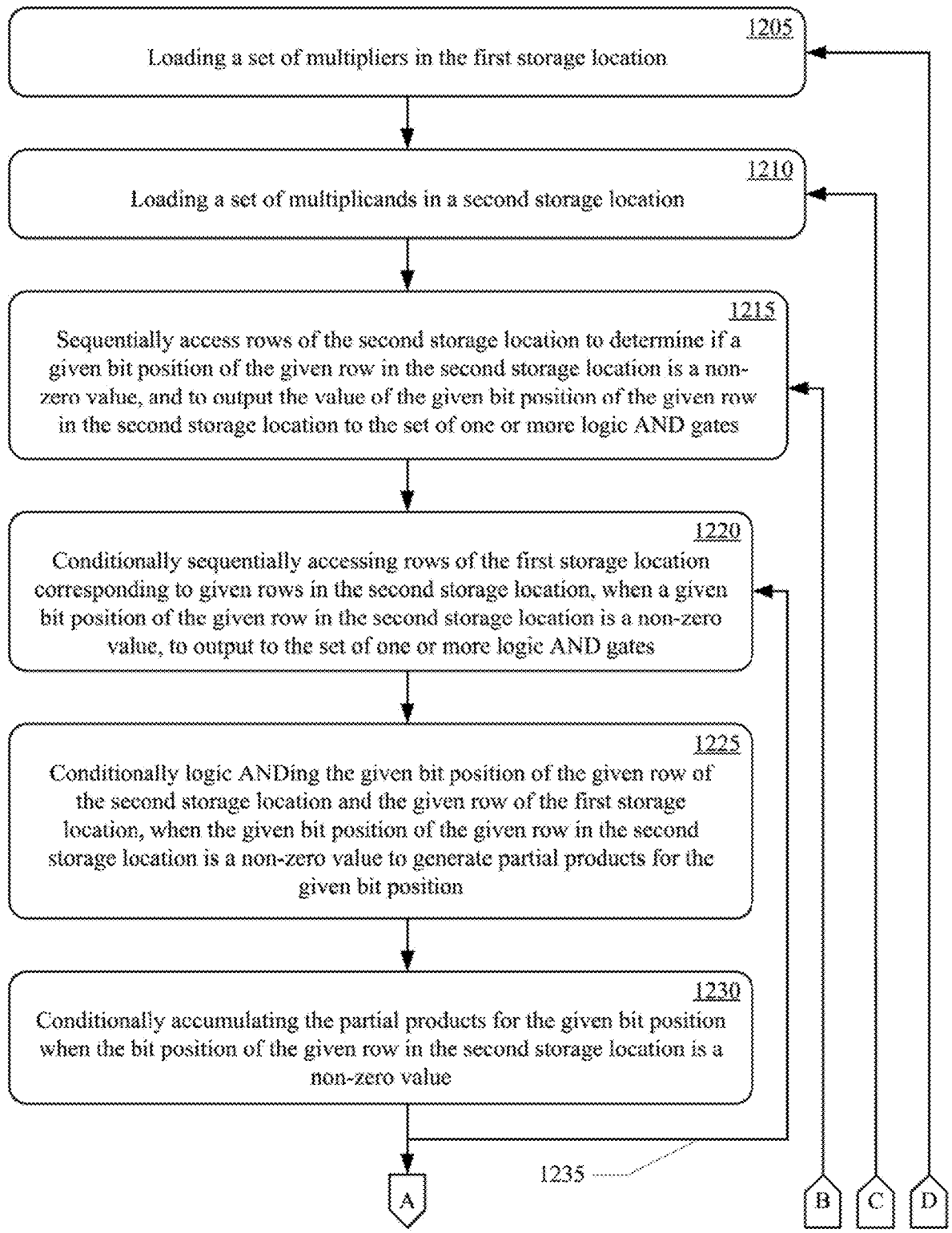
FIGS. 12A and 12B show method of computing a matrix dot product, in accordance with aspects of the present technology.
Figure 12B:
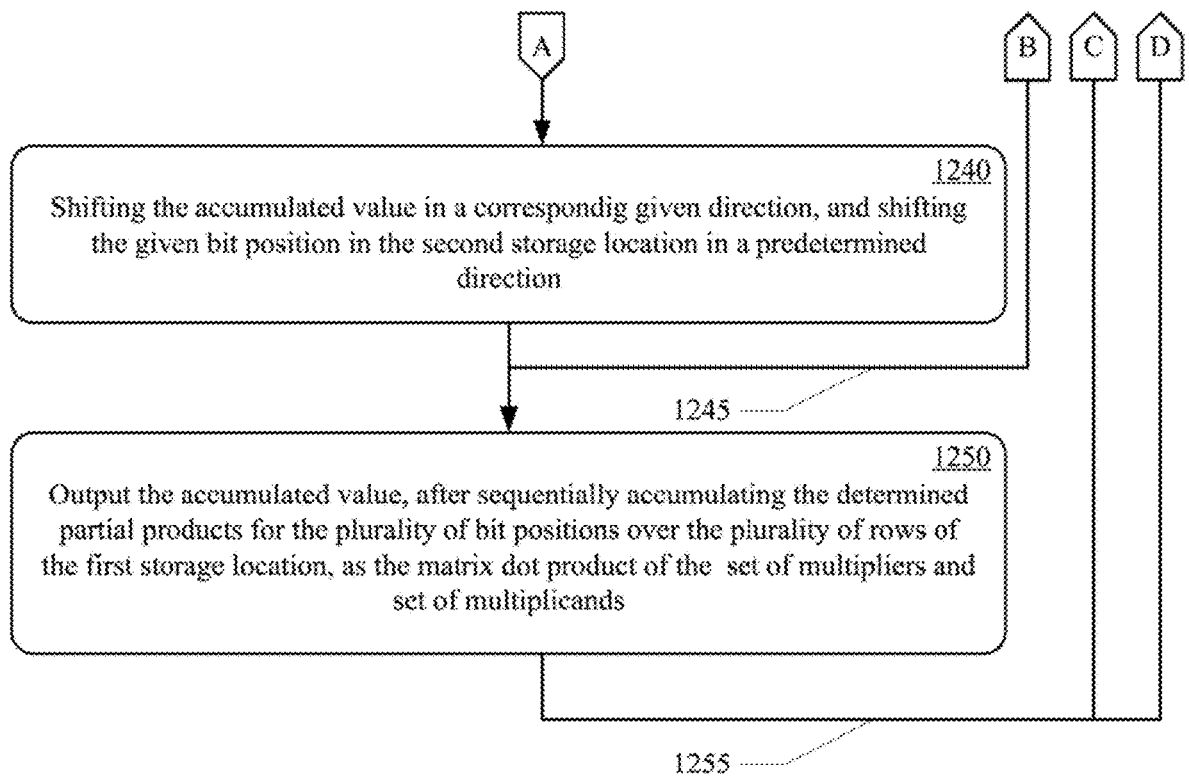

Referring now to FIG. 11, a memory device configured to compute matrix dot products, in accordance with aspects of the present technology, is shown. The memory device 1100 can include a first storage location 1105, a second storage location 1110, bit masking logic 1115, one or more readout circuitry 1120, 1125, logic AND circuitry 1130, 1135, one or more accumulators 1140, 1145, and one or more shift registers 1150, 1155. In one implementation, the first storage location 1105 can be a resistive random access memory (RRAM), and the second storage location 1110 can be a set of registers. In another implementation, the second storage location 1110 can be a static random access memory (SRAM). For purposes of explaining aspects of the present technology, the first and second storage locations 1105, 1110 are illustrated as storing respective matrices. However, more commonly, the first and second matrix are stored in respective portions of much larger first and second storage locations. The memory device configured to compute matrix dot products will be further explained with reference to FIGS. 12A and 12B.

To compute a matrix dot product, a set of multipliers can be loaded into the first storage location 1105, at 1205. In one implementation, a first matrix A of r rows and c columns of elements, wherein each element can be n-bits, can be loaded into the first storage location 1105. A set of multiplicands can be loaded into the second storage location 1110, at 1210. In one implementation, a second matrix X of r n-bit element values can be loaded into the second storage location 1110. In another implementation, the second storage location 1110 can include r rows of single bit registers for storing a respective given bit of the r elements of matrix X. For purposes of explaining aspects of the present technology, as illustrated in FIG. 1, the first storage location 1105 can store a 12×2 matrix, wherein each element is 4-bits, and the second storage location 1110 can store a 12×1 matrix, wherein each element is 4-bits. However, the first and second storage locations 1105, 1110 can be configured to store any predetermined number of r rows of elements, and the first storage location 1105 can be configured to store any predetermined number of c elements, wherein n-bit element values can be of any predetermined number of bits.

At 1215, the bit masking logic 1115 can be configured to determine the bit values 1160 for a given bit position in the rows of the second storage location 1110. For example, the bit masking logic 1115 can access the second storage location 1110 to determine if the given bit position in each row contains a '0' or '1' value.

At 1220, the bit masking logic 1115 can be configured to conditionally sequentially access the rows in the first storage location 1105 based on the value of the given bit of the corresponding row in the second storage location 1110. For example, if the given bit of the corresponding row in the second storage location 1115 contains a '1' value, read biasing and sensing can be enabled to access the corresponding row 1165 in the first storage location 1105. If the given bit of the corresponding rows in the second storage location contains a '0' value, read biasing and sensing of the first storage location 1105 can be disabled.

At 1225, the logic AND circuitry 1130, 1135 can be configured to conditionally AND the value of the given bit in the rows of the second storage location 1110 with the content of the corresponding row of the first storage location 1105 if the given bit of the corresponding row in the second storage location 1110 contains a '1' value. The value of the given bit of the row of the second storage location 1110 can be bitwise AND with the corresponding row of the first storage location 1105. The output of the logic AND circuit can be a partial product for a corresponding row of the first storage location 1105.

At 1230, the one or more accumulators 1140, 1145 can be configured to conditionally sequentially accumulate the partial products output by the logic AND circuitry 1130, 1135. If the given bit of the corresponding row in the second storage location 1110 contains a '1' value, the one or more accumulators 1140, 1145 can be enabled to accumulate the partial product output by the logic AND circuits. If the given bit of the corresponding rows in the second storage location contains a '0' value, the one or more accumulators 1140, 1145 can be disabled. The processes at 1220-1230 can be repeated, at 1235, for each row of the second matrix X for the given bit position. Accordingly, the bit masking logic 1115 can repeat the sequential access, bitwise logic AND, and accumulation based on the value of the given bit of the corresponding rows in the second storage location 1110. The sequential access, bitwise logic AND, and accumulation can be masked for given bits in rows that contain zero values in the second storage location 1110. The bit masking of each zero bit value X in the second storage location 1110 is more effective than the conventional art, which requires all bits in a given multiplicand to be zero.

At 1240, the one or more shift register 1150, 1155 can be configured to shift the accumulated value from the respective one or more accumulators 1140, 1145 in a first predetermine direction after the rows in the first storage location 1105 corresponding to non-zero values in the second storage location 1110 for a given bit position have been accumulated. The bit shifted accumulated value can then be loaded back into the corresponding accumulators 1140, 1145. The given bit position in the second storage location 1110 can also be shifted in a second predetermined direction, at 1240. In one implementation, when sequencing through the multiplicand from the most-significant-bit to the least-significant-bit, the accumulated value from the respective one or more accumulators 1140, 1145 can be shifted one bit to the left and then loaded back into the corresponding accumulators 1140, 1145. In addition, the given bit position in the second storage location 1110 can be shifted one bit to the left. If processing from the least-significant-bit to the most-significant-bit, the bit position in the second storage location can be shifted by one bit to the right, and the contents of the one or more accumulators 1140, 1145 can be shifted one bit to the right. The processes at 1220-1240 can be repeated, at 1245, for each bit position. For example, after sequentially biasing rows of the first storage location, sequentially sensing the rows in the first storage location and sequential accumulating the partial products for the most-significant-bit in the plurality of rows in the second storage location, the process can be repeated for the next most-significant-bit, and so on until the least-significant-bit is also processed.

At 1250, the accumulated value can be output after sequentially accumulating the determined partial products for the plurality of bit positions over the plurality of rows of the first storage location. The accumulated value can be output as the matrix dot product of the multipliers of the first matrix A and the multiplicands of the second matrix X. In one implementation, the accumulated value can be output for storage in the first or second storage location, to be used for example in another vector dot product calculation.

At 1255, the processes at 1210-1250 can be repeated to calculate another dot product utilizing the same first matrix A and a new instance of the second matrix X, wherein the new instance of the second matrix X is loaded into the second storage location at 1210. Accordingly, the first matrix A can be reused to calculate dot products for multiple instance of the second matrix X. Alternatively, the processes at 1205-1250 can be repeated, at 1255, to calculate another dot product utilizing new instances of the first matrix A and new instance of the second matrix X.

Aspects of the present technology can advantageously increase throughput of vector dot products as a result of masking each zero bit value in each multiplicand. Aspects of the present technology can also advantageously reduce energy consumption as a result of the masking each zero bit value in each multiplicand.

Figure 13A:
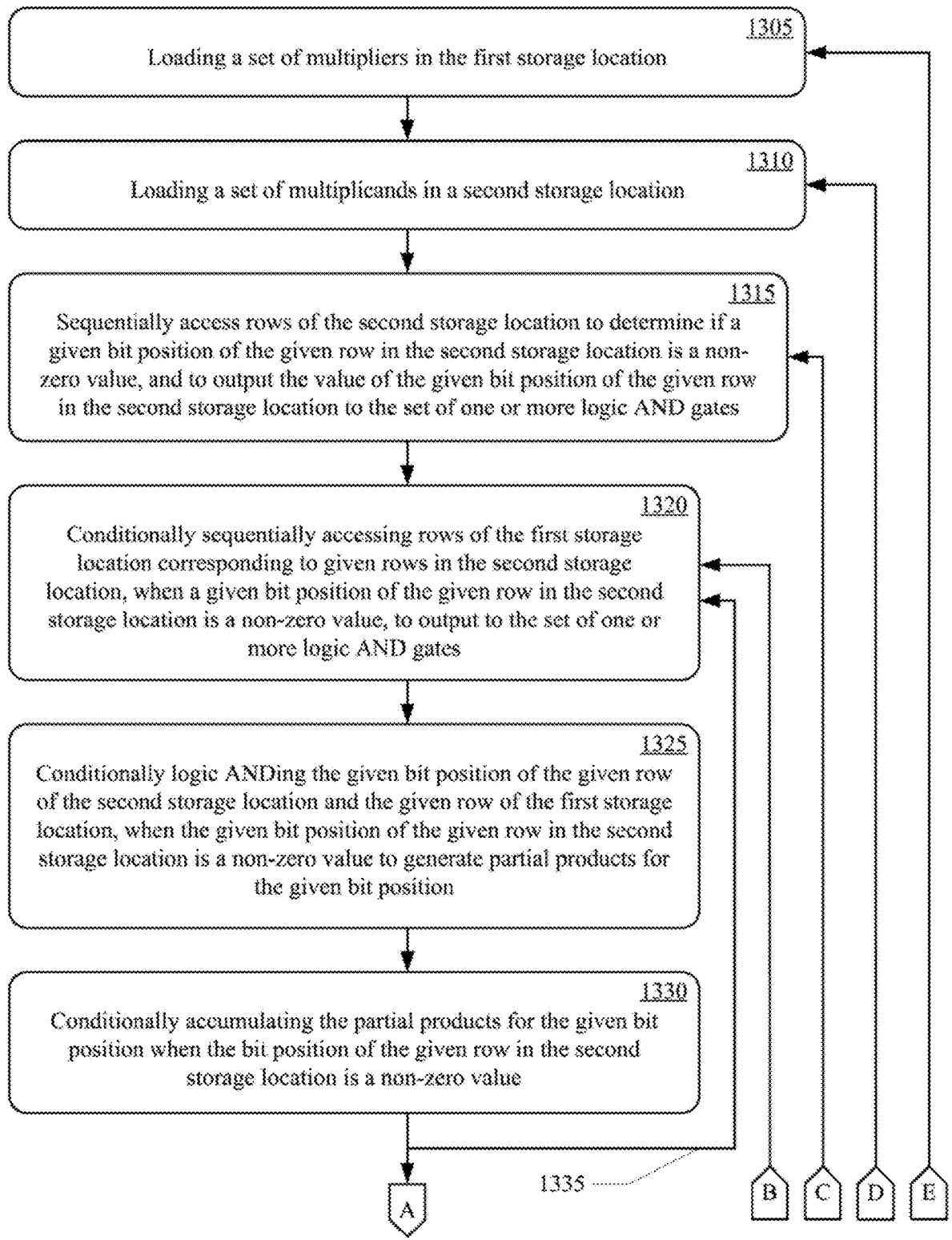
FIGS. 13A and 13B show method of computing a matrix dot product, in accordance with aspects of the present technology.
Figure 13B:
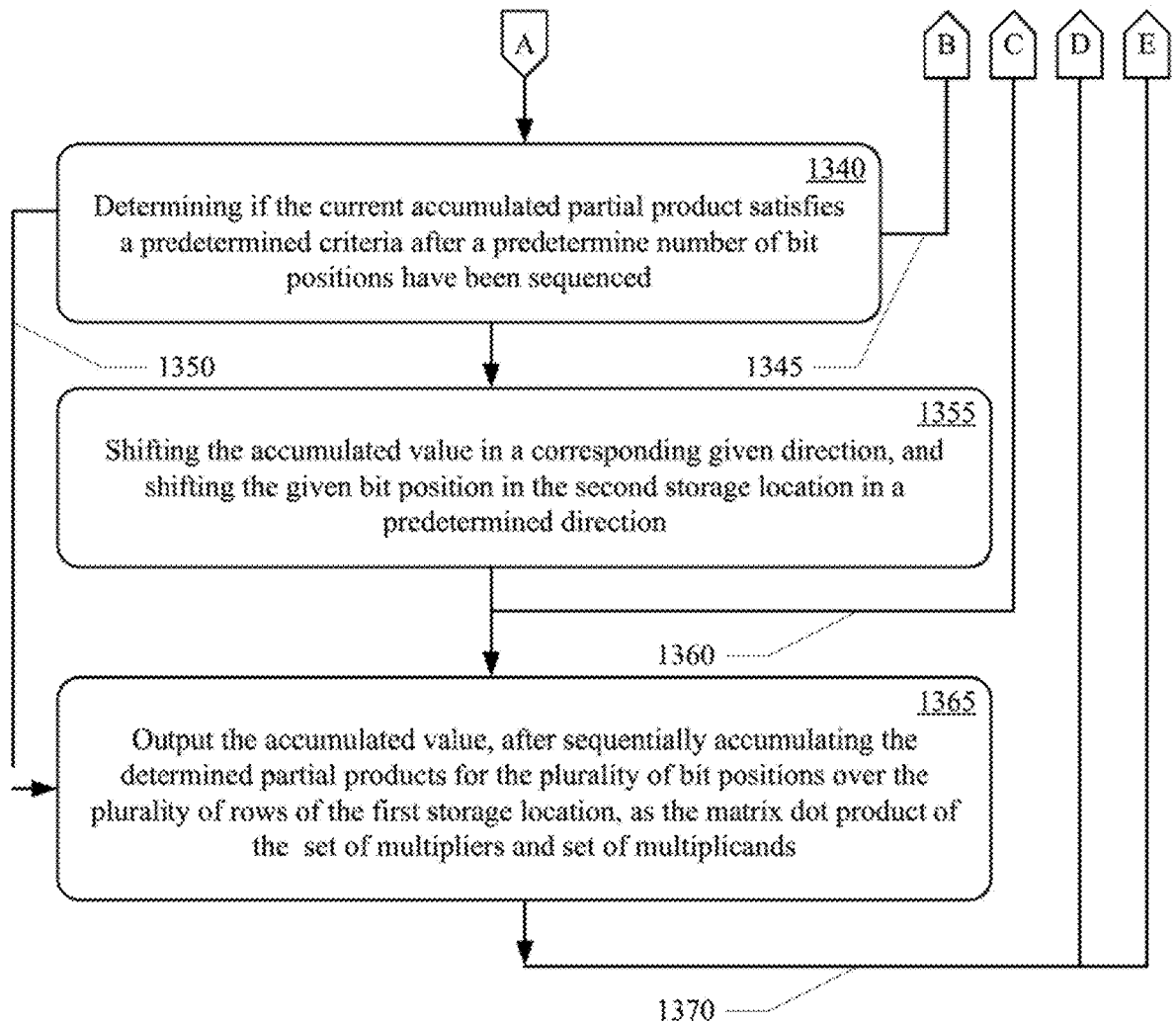

Referring now to FIGS. 13A and 13B, a method of calculating a vector dot product, in accordance with aspects of the present technology, is shown. At 1305, a set of multipliers can be loaded into the first storage location 1105. In one implementation, a first matrix A of r rows and c columns of elements, wherein each element can be n-bits, can be loaded into the first storage location 1105. A set of multiplicands can be loaded into the second storage location 1110, at 1310. In one implementation, a second matrix X of r n-bit element values can be loaded into the second storage location 1110. In another implementation, the second storage location 1110 can include r rows of single bit registers for storing a respective given bit of the r elements of matrix X.

At 1315, the bit masking logic 1115 can be configured to determine the bit values for a given bit position in the rows of the second storage location 1110. For example, the bit masking logic 1115 can access 1160 the second storage location 1110 to determine if the given bit position in each row contains a '0' or '1' value.

At 1320, the bit masking logic 1115 can be configured to conditionally sequentially access the rows in the first storage location 1105 based on the value of the given bit of the corresponding row in the second storage location 1110. For example, if the given bit of the corresponding row in the second storage location 1110 contains a '1' value, read biasing and sensing can be enabled to access the corresponding row 1165 in the first storage location 1110. If the given bit of the corresponding rows in the second storage location contains a '0' value, read biasing and sensing of the first storage location 1105 can be disabled.

At 1325, the logic AND circuitry 1130, 1135 can be configured to conditionally AND the value of the given bit in the rows of the second storage location 1110 with the content of the corresponding row of the first storage location 1105 if the given bit of the corresponding row in the second storage location 1110 contains a '1' value. The value of the given bit of the row of the second storage location 1110 can be bitwise AND with the corresponding row of the first storage location 1105. The output of the logic AND circuit can be a partial product for corresponding rows.

At 1330, the one or more accumulators 1140, 1145 can be configured to conditionally sequentially accumulate the partial products output by the logic AND circuitry 1130, 1135. If the given bit 1165 of the corresponding row in the second storage location 1110 contains a '1' value, the one or more accumulators 1140, 1145 can be enabled to accumulate the partial product output by the logic AND circuitry 1130, 1135. If the given bit of the corresponding row in the second storage location 1110 contains a '0' value, the one or more accumulators 1140, 1145 can be disabled. The processes at 1320-1330 can be repeated at 1335, for each row of the second matrix X for the given bit position.

At 1340, it can be determined if the current accumulated partial product satisfies a predetermined criteria after a predetermined number of bit positions have been sequenced. For example, to implement a rectified linear unit (ReLU) function, it can be determined if the current accumulated partial product of the plurality of rows is less than zero after m significant bits of the n significant bits. Generally, if the current accumulated partial product is less than zero after a predetermined number of most-significant-bits have been processed there can be a relatively low probability that the remaining least-significant-bits will result in an accumulated partial product that is greater than zero. If the predetermined number of bit positions have not been processed or the current accumulated partial product satisfies the predetermined criteria, the processes at 1320-1340 can be repeated, at 1345, for each row of the second matrix X for the given bit position. Accordingly, the bit masking logic 1115 can conditionally sequentially access rows of the first storage location corresponding to the given row in the second storage location. The logic AND circuits 1130, 1135 can also repeat conditionally ANDing the multiplicand and the given bit position of the multiplier when the bit position of the given row is a non-zero value. In addition, the one or more accumulators 1140, 1145 can repeat conditionally accumulating the partial products output by the logic AND circuits 1130, 1135. If the predetermined number of bit positions have been processed and the current accumulated partial product does not satisfy the predetermined criteria, the process can proceed, at 1350, to process 1365 as described below. For example, if the current accumulated partial product is less than zero after m of the n bits have been processed, the calculation of the vector dot product can be terminated early. When calculation of the vector dot product is terminated early, at 1350, the number of row accesses, bitwise ANDing, and accumulating operations are reduced.

At 1355, the one or more shift register 1150, 1155 can be configured to shift the accumulated value from the respective one or more accumulators 1140, 1145 in a first predetermine direction after the rows in the first storage location 1105 corresponding to non-zero values in the second storage location 1110 for a given bit position have been accumulated. The bit shifted accumulated value can then be loaded back into the corresponding accumulators 1140, 1145. The given bit position in the second storage location 1110 can also be shifted in a second predetermined direction, at 1350. In one implementation, when sequencing through the multiplicand from the most-significant-bit to the least-significant-bit, the accumulated value from the respective one or more accumulators 1140, 1145 can be shifted one bit to the left and then loaded back into the corresponding accumulators 1140, 1145. In addition, the given bit position in the second storage location can be shifted one bit to the left. If processing from the least-significant-bit to the most-significant-bit, the bit position in the second storage location can be shifted by one bit to the right, and the contents of the one or more accumulators 1140, 1145 can be shifted one bit to the right. The processes at 1320-1355 can be repeated, at 1360, for each bit position. For example, after sequentially biasing rows of the first storage location, sequentially sensing the rows in the first storage location and sequential accumulating the partial products for the most-significant-bit in the plurality of rows in the second storage location, the process can be repeated for the next most-significant-bit, and so on until the least-significant-bit is also processed.

At 1365, the accumulated value can be output after sequentially accumulating the determined partial products for the plurality of bit positions over the plurality of rows of the first storage location. The accumulated value can be output as the matrix dot product of the multipliers of the first matrix A and the multiplicands of the second matrix X. In one implementation, the accumulated value can be output for storage in the first or second storage location, to be used for example in another vector dot product calculation.

At 1370, the processes at 1310-1365 can be repeated to calculate another dot product utilizing the same first matrix A and a new instance of the second matrix X, wherein the new instance of the second matrix X is loaded into the second storage location at 1310. Accordingly, the first matrix A can be reused to calculate dot products for multiple instance of the second matrix X. Alternatively, the processes at 1305-1365 can be repeated, at 1370, to calculate another dot product utilizing new instances of the first matrix A and new instance of the second matrix X.

Early termination when the current accumulated partial product does not satisfy a predetermined criteria after a predetermined number of bit positions have been sequenced can advantageously be combined with zero bit masking to advantageously further increase throughput of vector dot products. Early termination can also be advantageously combined with zero bit masking to advantageously further reduce energy consumption.

Figure 14A:
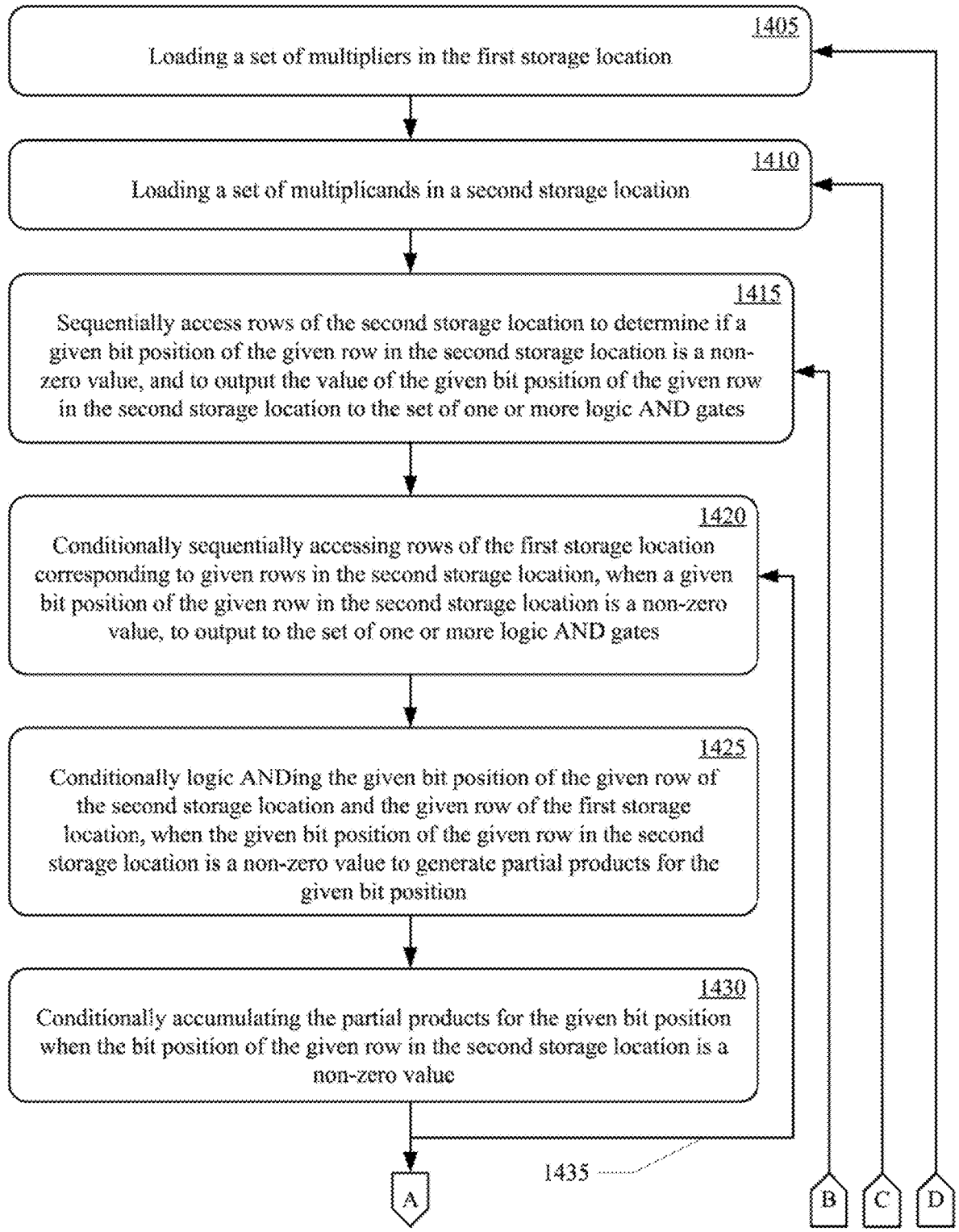
FIGS. 14A and 14B show method of computing a matrix dot product, in accordance with aspects of the present technology.
Figure 14B:
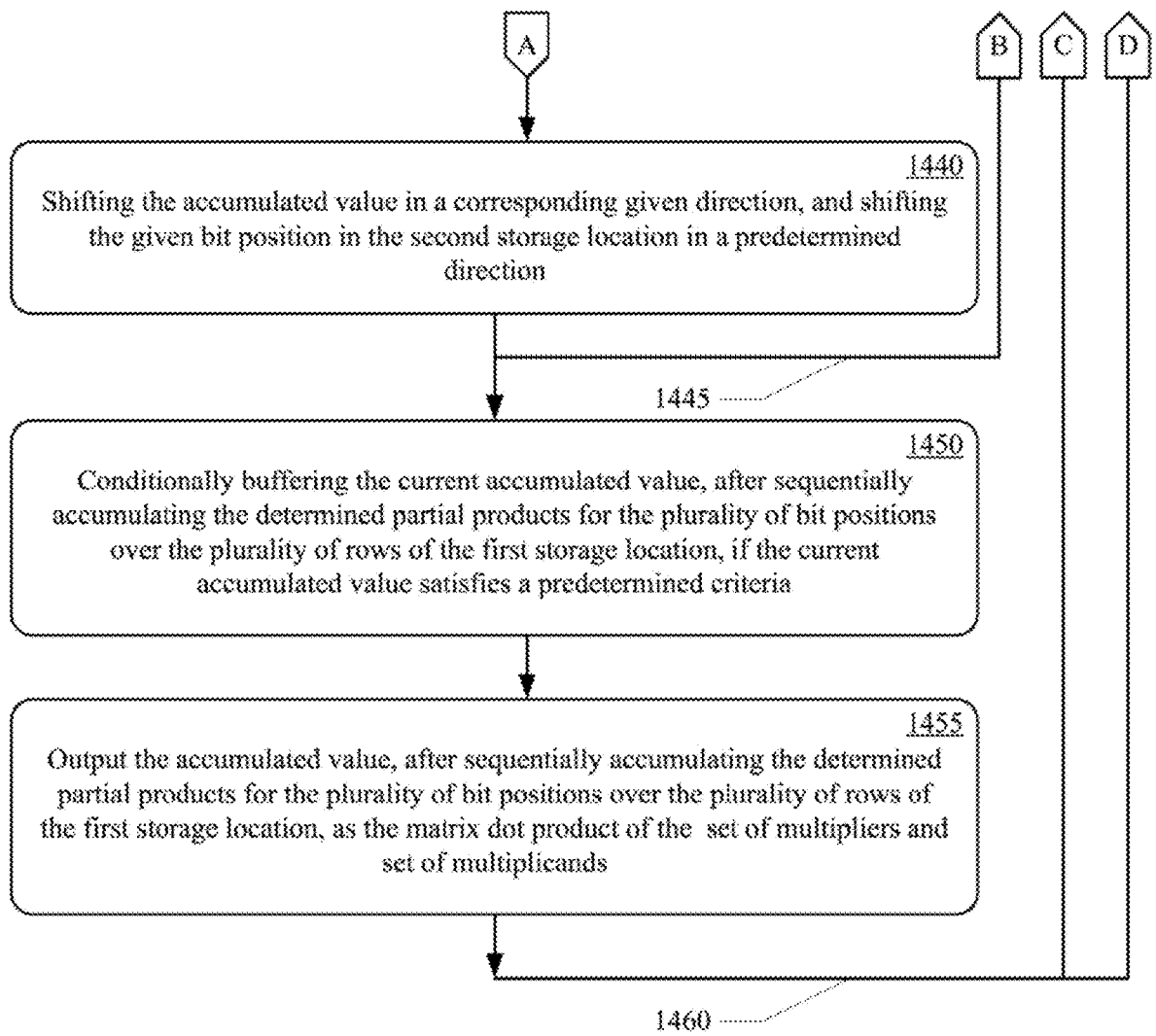

Referring now to FIGS. 14A and 14B, a method of calculating a matrix dot product, in accordance with aspects of the present technology, is shown. At 1405, a set of multipliers can be loaded into the first storage location 1105. In one implementation, a first matrix A of r rows and c columns of elements, wherein each element can be n-bits, can be loaded into the first storage location 1105. A set of multiplicands can be loaded into the second storage location 1110, at 1410. In one implementation, a second matrix X of r n-bit element values can be loaded into the second storage location 1110. In another implementation, the second storage location 1110 can include r rows of single bit registers for storing a respective given bit of the r elements of matrix X.

At 1415, the bit masking logic 1115 can be configured to determine the bit values for a given bit position in the rows of the second storage location 1110. For example, the bit skipping logic 1115 can access 1160 the second storage location 1110 to determine if the given bit position in each row contains a '0' or '1' value.

At 1420, the bit skipping logic 1115 can be configured to conditionally sequentially access the rows in the first storage location 1105 based on the value of the given bit of the corresponding row in the second storage location 1110. For example, if the given bit of the corresponding row in the second storage location 1115 contains a '1' value, read biasing and sensing can be enabled to access 1165 the corresponding row in the first storage location 1105. If the given bit of the corresponding rows in the second storage location 1110 contains a '0' value, read biasing and sensing of the first storage location 1105 can be disabled.

At 1425, the logic AND circuitry 1130, 1135 can be configured to conditionally AND the value of the given bit in the rows of the second storage location 1110 with the content of the corresponding row of the first storage location 1105 if the given bit of the corresponding row in the second storage location 1110 contains a '1' value. The value of the given bit of the row of the second storage location 1110 can be bitwise ANDed with the corresponding row of the first storage location 1105. The output of the logic AND circuitry 1130, 1135 can be a partial product for a corresponding rows.

At 1430, the one or more accumulators 1140, 1145 can be configured to conditionally sequentially accumulate the partial products output by the logic AND circuitry 1130, 1135. If the given bit of the corresponding row in the second storage location 1110 contains a '1' value, the one or more accumulators 1140, 1145 can be enabled to accumulate the partial product output by the logic AND circuitry 1130, 1135. If the given bit of the corresponding rows in the second storage location 1110 contains a '0' value, the one or more accumulators 1140, 1145 can be disabled. The processes at 1420-1430 can be repeated, at 1435, for each row of the second matrix X for the given bit position. Accordingly, the bit masking logic 1115 can conditionally repeat the sequential access, bitwise logic AND, and accumulation based on the value of the given bit of the corresponding rows in the second storage location 1110. The sequential access, bitwise logic AND, and accumulation can be masked for given bits in rows that contain zero values in the second storage location 1110. The bit masking of each zero bit value in the second matrix X in the second storage location 1110 is more effective than the conventional art, which requires all bits in a given multiplicand to be zero.

At 1440, the one or more shift register 1150, 1155 can be configured to shift the accumulated value from the respective one or more accumulators 1140, 1145 in a first predetermine direction after the rows in the first storage location 1105 corresponding to non-zero values in the second storage location 1110 for a given bit position have been accumulated. The bit shifted accumulated value can then be loaded back into the corresponding accumulators 1140, 1145. The given bit position in the second storage location 1110 can also be shifted in a second predetermined direction, at 1440. In one implementation, when sequencing through the multiplicand from the most-significant-bit to the least-significant-bit, the accumulated value from the respective one or more accumulators 1140, 1145 can be shifted one bit to the left and then loaded back into the corresponding accumulators 1140, 1145. In addition, the given bit position in the second storage location can be shifted one bit to the left. If processing from the least-significant-bit to the most-significant-bit, the bit position in the second storage location can be shifted by one bit to the right, and the contents of the one or more accumulators 1140, 1145 can be shifted one bit to the right. The processes at 1420-1440 can be repeated 1445 for each bit position. For example, after conditionally sequentially biasing rows of the first storage location, sequentially sensing the rows in the first storage location and sequential accumulating the partial products for the most-significant-bit in the plurality of rows in the second storage location, the process can be repeated for the next most-significant-bit, and so on until the least-significant-bit is also processed.

At 1450, the accumulated value can be buffered, after sequentially accumulating the determined partial products for the plurality of bit positions over the plurality of rows of the first storage location 1105, if the current accumulated value satisfies a predetermined criteria. For example, the present accumulated value can be buffered if greater than current buffered accumulated value to implement a max pooling operation. The conditional output buffering can advantageously reduce output bandwidth and or downstream memory access bandwidth. In another example, output buffering can also act as a pipeline stage to improve timing.

At 1455, the accumulated value can be output after sequentially accumulating the determined partial products for the plurality of bit positions over the plurality of rows of the first storage location. The accumulated value can be output as the matrix dot product of the multipliers of the first matrix A and the multiplicands of the second matrix X. In one implementation, the accumulated value can be output for storage in the first or second storage location, to be used for example in another vector dot product calculation.

At 1460, the processes at 1410-1455 can be repeated to calculate another dot product utilizing the same first matrix A and a new instance of the second matrix X, wherein the new instance of the second matrix X is loaded into the second storage location at 1410. Accordingly, the first matrix A can be reused to calculate dot products for multiple instance of the second matrix X. Alternatively, the processes at 1405-1455 can be repeated, at 1460, to calculate another dot product utilizing new instances of the first matrix A and new instance of the second matrix X.

In additional embodiments, the early termination processes described above with reference to FIGS. 12A and 12B and the accumulated value buffer described above with reference to FIGS. 13A and 13B can be combined with the zero bit masking processes.

Figure 15:
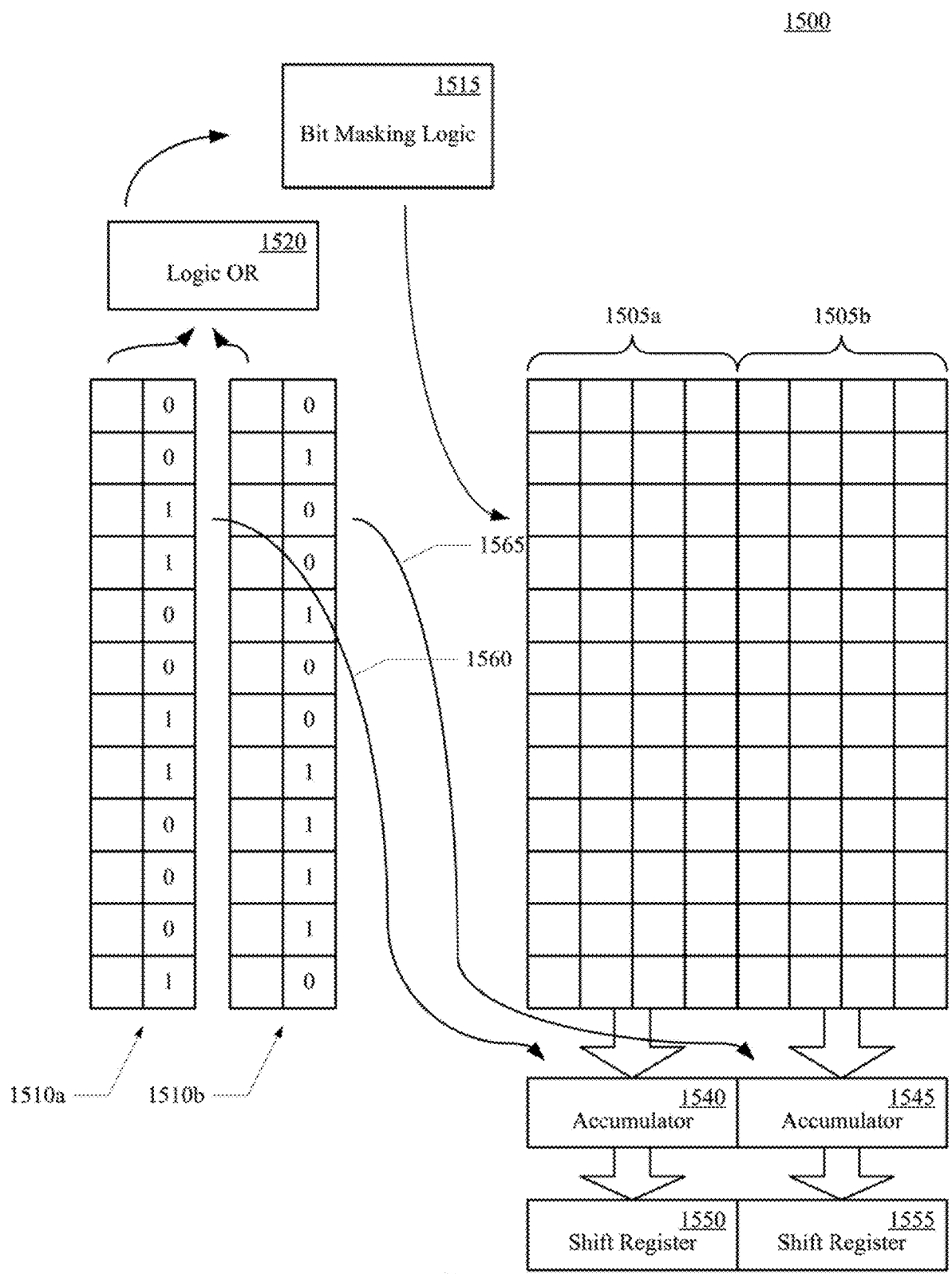
FIG. 15 shows a memory device configured to compute matrix dot products, in accordance with aspects of the present technology.
Figure 16A:
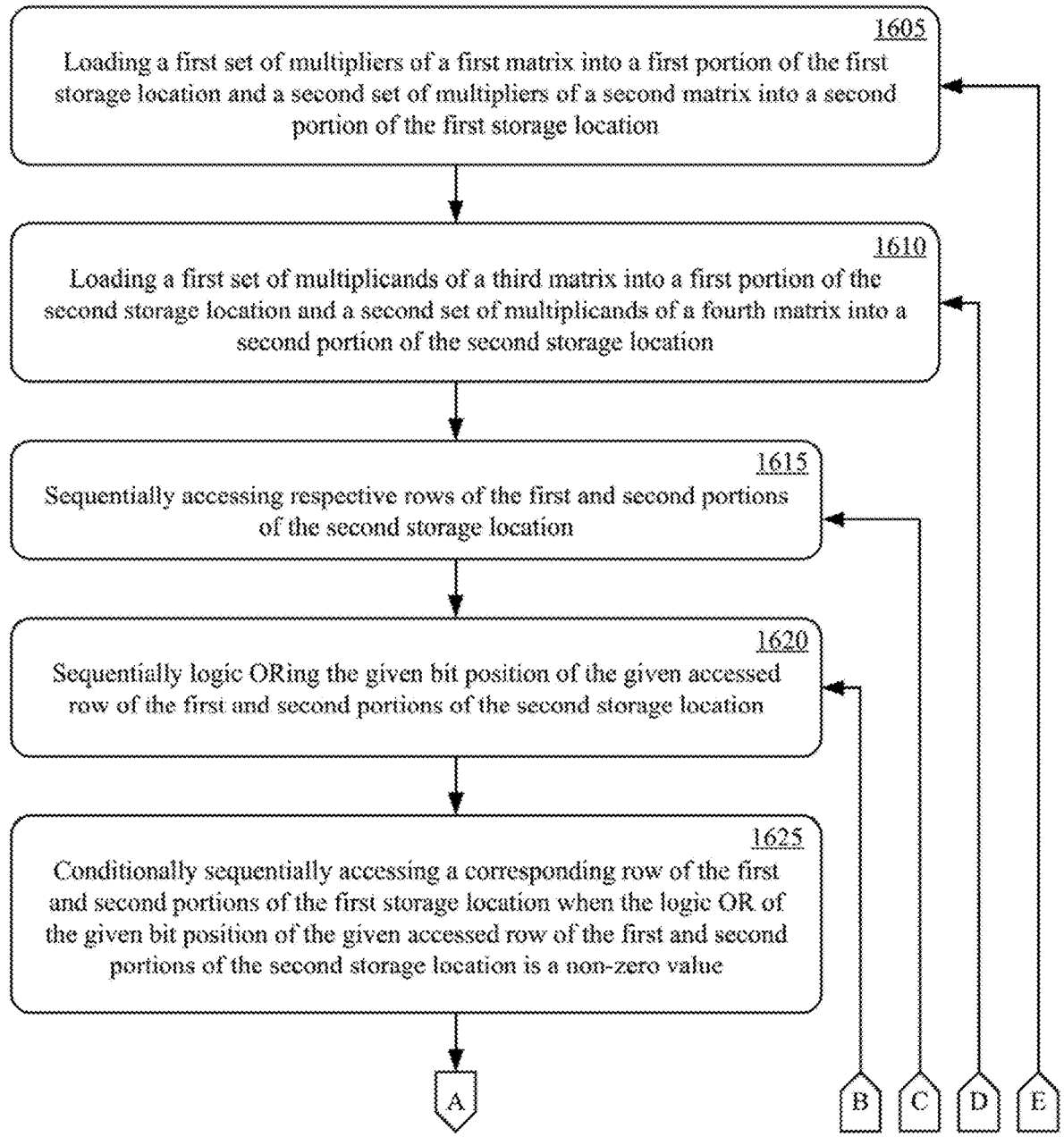
FIGS. 16A and 16B show method of computing a matrix dot products, in accordance with aspects of the present technology.
Figure 16B:
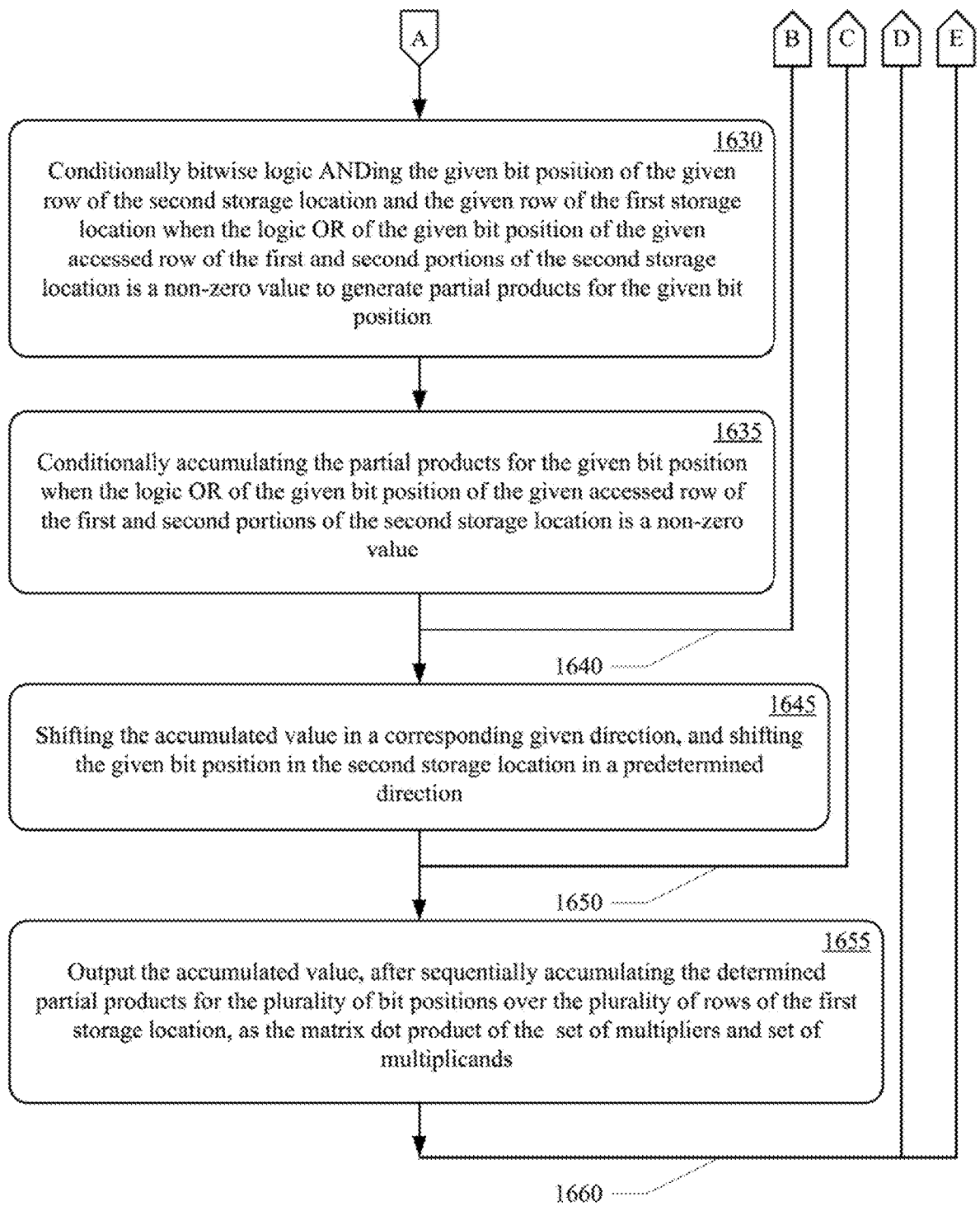

In various instances, the first storage location, or allocated portions thereof, may not be filled with a given instance of a first matrix A. Accordingly, it can be advantageous to calculate a plurality of vector dot products simultaneously to increase utilization of the first storage location. Referring now to FIG. 15, a memory device configured to compute matrix dot products, in accordance with aspects of the present technology, is shown. The memory device 1500 can include a first storage location 1505a, 1505b, a second storage location 1510a, 1510b, bit masking logic 1515, logic OR circuitry 1520, one or more readout circuitry (not shown), one or more logic AND circuitry (not shown), accumulators 1540, 1545, and shift register 1540, 1545. The readout circuitry and logic AND circuitry have been previously illustrated and described above and are not illustrated in the present figure to provide a compact illustration of the aspects of the present technology. The memory device configured to compute matrix dot products will be further explained with reference to FIGS. 16A and 16B.

To compute matrix dot products, a plurality of sets of multipliers can be loaded into respective portions of the first storage location 1505a, 1505b, at 1605. In one implementation, a first matrix A1 of r rows of elements can be loaded into the first portion of the first storage location 1505a. A second matrix A2 of r rows can be loaded into the second portion of the first storage location 1505b. The corresponding rows of the first and second matrices A1, A2 loaded in the first and second portion of the first storage location 1505a, 1505b can share respective common word lines. A plurality of sets of multiplicands can be loaded into respective portions of the second storage location 1510a, 1510b, at 1610. In one implementation, a third matrix X1 of r element values can be loaded into the first portion of the second storage location 1510a. A fourth matrix X2 of r element values can be loaded into a second portion of the second storage location 1510b. In another implementation, the second storage location 1510a, 1510b can include a first and second set of r rows of single bit registers for storing a respective given bit of the r elements of third matrix X1, and fourth matrix X2 respectively. For purposes of explaining aspects of the present technology, as illustrated in FIG. 15, the two matrices are loaded into respective portions of the first storage location, and two matrices are loaded into respective portions of the second storage location. However, the first and second storage locations can be configured to store any number of sets of matrices.

At 1615, the bit masking logic 1515 can be configured to sequentially access rows of the first and second portions of the second storage location 1510a, 1510b. For example, the bit skipping logic 1515 can access the second storage location 1510a, 1510b to determine if the given bit position in the corresponding portions of the given row contains a '0' or '1' value.

At 1620, the logic OR circuitry 1520 can be configured to sequentially logic OR the given bit position of the given accessed row of the first and second portions of the second storage location 1510a, 1510b. For example, if the given bit in the given row of either or both the first and second portions of the second storage location 1510a, 1510b contain a '1' value, the logic OR circuitry 1510 can output a '1' value. If the given bit in the given row of both the first and second portions of the second storage location 1510a, 1510b contain a '0' value, the logic OR circuitry 1520 can output a '0' value.

At 1625, the bit masking logic 1515 can be configured to conditionally sequentially access the corresponding row of the first and second portions in the first storage location 1505a, 1505b when the logic OR of the given bit position of the given accessed row of the first and second portions of the second storage location 1510a, 1510b is a non-zero value. For example, when the logic OR of the given bit position of the given accessed row of the first and second portions of the second storage location 1510a, 1510b is a non-zero value indicating that the given bit position of the given accessed row of either the first or second portion of the second storage location 1510a, 1510b or both contain a '1', read biasing and sensing can be enabled to access the corresponding row in the first and second portions of the first storage location 1505a, 1505b. If the given bit position of the given accessed row of both the first or second portion of the second storage location 1510a, 1510b contain a '0' value, read biasing and sensing of the first storage location 1505a, 1505b can be disabled.

At 1630, the logic AND circuits can be configured to conditionally AND the value of the given bit in the row of the respective first and second portions of the second storage location 1510a, 1510b with the content of the corresponding row of the respective first and second portions of the first storage location 1505a, 1505b when the logic OR of the given bit position of the given accessed row of the first and second portions of the second storage location 1510a, 1510b is a non-zero value. For example, a given bit in the row in the respective first portion of the second storage location 1510a can be a '1', which can be bit wise ANDed 1560 with the content of the corresponding row in the first portion of the first storage location 1505a. The given bit in the row of the respective second portion of the second storage location 1510a can be a '0', which can be bit wise ANDed 1565 with the content of the corresponding rows in the second portion of the first storage location 1505b. The output of the logic AND circuit can be a partial product for a corresponding portion of the rows.

At 1635, the accumulators 1540, 1545 can be configured to conditionally sequentially accumulate the partial products output by the logic AND circuitry. For example, if the given bit of the corresponding row in the first portion of the second storage location 1510a contains a '1' value, the respective accumulator 1540 can be enabled to accumulate the partial product output by the respective logic AND circuitry. If the given bit of the corresponding row in the second portion of the second storage location 1510b contains a '0' value, the respective accumulator 1545 can be disabled. The processes at 1620-1635 can be repeated, at 1640, for each row of the second matrix X for the given bit position. Accordingly, the bit masking logic 1615 can repeat the sequential access of rows of the second storage location 1510a, 1510b, sequential ORing, conditional sequential access of rows of the first storage location 1505a, 1505b, conditional bitwise logic ANDing, and conditional accumulation based on the value of the given bit of the corresponding rows in the respective plurality of portions of the second storage location 1510a, 1510b. The conditional sequential access of rows of the first storage location 1505a, 1505b, conditional bitwise logic ANDing, and conditional accumulation can be masked for given bits in corresponding rows that contain zero values in the corresponding portions of the second storage location 1510a, 1510b.

At 1645, the shift register 1550, 1555 can be configured to shift the accumulated values from the respective accumulators 1540, 1545 in a first predetermine direction after the rows in the first storage location 1505a, 1505b corresponding to non-zero values in the respective portions of the second storage location 1510a, 1510b for a given bit position have been accumulated. The bit shifted accumulated value can then be loaded back into the corresponding accumulators 1540, 1545. The given bit position in the corresponding portions of the second storage location 1510a, 1510b can also be shifted in a second predetermined direction, at 1645. In one implementation, when sequencing through the multiplicand from the most-significant-bit to the least-significant-bit, the accumulated value from the respective accumulators 1540, 1545 can be shifted one bit to the left and then loaded back into the corresponding accumulators 1540, 1545. In addition, the given bit position in the second storage location can be shifted one bit to the left. If processing from the least-significant-bit to the most-significant-bit, the bit position in the second storage location can be shifted by one bit to the right, and the contents of the one or more accumulators 1540, 1545 can be shifted one bit to the right. The processes at 1620-1645 can be repeated, at 1650, for each bit position. For example, after sequential access of rows of the second storage location 1510a, 1510b, sequential ORing, conditional sequential access of rows of the first storage location 1505a, 1505b, conditional bitwise logic ANDing, and conditional accumulation based on the value of the given bit of the corresponding rows in the respective plurality of portions of the second storage location 1510a, 1510b for the most-significant-bit in the plurality of rows in the second storage location, the process can be repeated for the next most-significant-bit, and so on until the least-significant-bit is also processed.

At 1655, the accumulated values can be output after sequentially accumulating the determined partial products for the plurality of bit positions over the plurality of rows of the respective portions of the first storage location 1505a, 1505b. The accumulated values can be output as respective matrix dot product of the multipliers of the first matrix A1 and the multiplicands of the third matrix X1, and the matrix dot product of the multipliers of the second matrix A2 and the multiplicands of the fourth matrix X2. In one implementation, the accumulated values can be output for storage in the first or second storage location, to be used for example in another vector dot product calculation.

At 1660, the processes at 1610-1655 can be repeated to calculate additional dot products utilizing the same first matrix A1 and second matrix A2, and a new instance of the respective third matrix X1 and fourth matrix X2, wherein the new instances of the third matrix X1 and fourth matrix X2 are loaded into the second storage location at 1610. Accordingly, the first matrix A1 and second matrix A2 can be reused to calculate dot products for multiple instance of the third matrix X1 and fourth matrix X2 respectively. Alternatively, the processes at 1605-1655 can be repeated, at 1660, to calculate another dot product utilizing new instances of the first matrix A1 and second matrix A2, and respective new instances of the third matrix X1 and fourth matrix X2.

In addition, the early termination and or the conditional buffering processes described above with reference to FIGS. 9A, 9B, 10A, 10B, 13A, 13B, 14A and 14B can be readily adapted for calculating matrix dot products for set of matrices loaded into respective portions of first and second storage locations as described above with reference to FIGS. 15 and 16.

The following examples pertain to specific technology embodiments and point out specific features, elements, or steps that may be used or otherwise combined in achieving such embodiments.

Example 1 includes a device comprising: a first storage location configured to store a set of multipliers; a second storage location configured to store a set of multiplicands; a bit skipping logic configured to determine rows for a given bit position in a second storage location that hold non-zero values; one or more readout circuitry configured to; sequential bias rows of the first storage location corresponding to non-zero value rows for the given bit position in the second storage location; and sequentially sense the rows of the first storage location, corresponding to the rows for the given bit position in the second storage location containing non-zero values, to determine partial products for the given bit position; one or more accumulators configured to accumulate the determined partial products for the given bit position; and one or more shift registers configured to shift the accumulated values, after sequentially accumulating the determined partial products for the plurality of bit positions over the plurality of rows of the first storage location, as a matrix dot product of the set of multipliers and the set of multiplicands.

Example 2 includes the device of Example 1, further comprising: an early termination logic configured to determine if a current accumulated partial product satisfies a predetermined criteria after a predetermined number of bit positions of the set of multiplicands in the second storage location have been processed.

Example 3 includes the device of Example 2, wherein the early termination logic is configured to determine if a current accumulated partial product is less than zero.

Example 4 includes the device of Example 1, further comprising: a buffer configured to conditionally buffer the current accumulated value, after sequentially accumulating the determined partial products for the plurality of bit positions over the plurality of rows of the first storage location, if the current accumulated value satisfies a predetermined criteria.

Example 5 includes the device of Example 1, wherein: the first storage location comprises a resistive random access memory (RRAM); and the second storage location comprises a set of registers.

Example 6 includes the device of Example 5, wherein the set of registers store respective ones of the set of multiplicands.

Example 7 includes the device of Example 5, wherein the set of register store the given bit location of respective ones the set of multiplicands.

Example 8 includes the device of Example 1, wherein: the first storage location comprises a resistive random access memory (RRAM); and the second storage location comprises a static random access memory (SRAM).

Example 9 includes a device comprising: a first storage location configured to store a set of multipliers; a second storage location configured to store a set of multiplicands; a bit masking logic configured to; sequentially access respective rows of the second storage location to determine if a given bit position of the given row in the second storage location is a non-zero value; and conditionally sequentially accessing rows of the first storage location corresponding to given rows in the second storage location when a given bit position of the given row in the second storage location is a non-zero value; logic AND circuitry configured to conditionally bitwise AND the given bit position of the given row of the second storage location and the given row of the first storage location, when the given bit position of the given row in the second storage location is a non-zero value to generate partial products for the given bit position; one or more accumulators configured to conditionally accumulate the partial products for the given bit position when the bit position of the given row in the second storage location is a non-zero value; one or more shift registers configured to shift the accumulated value in a corresponding direction, wherein the given bit position in the second storage location is sequentially shifted in a predetermined direction.

Example 10 includes the device of Example 9, further comprising: an early termination logic configured to determine if a current accumulated partial product satisfies a predetermined criteria after a predetermined number of bit positions of the set of multiplicands in the second storage location have been processed.

Example 11 includes the device of Example 10, wherein the early termination logic is configured to determine if a current accumulated partial product is less than zero.

Example 12 includes the device of Example 9, further comprising: a buffer configured to conditionally buffer the current accumulated value, after sequentially accumulating the determined partial products for the plurality of bit positions over the plurality of rows of the first storage location, if the current accumulated value satisfies a predetermined criteria.

Example 13 includes the device of Example 9, wherein: the first storage location comprises a resistive random access memory (RRAM); and the second storage location comprises a set of registers.

Example 14 includes the device of Example 13, wherein the set of registers store respective ones of the set of multiplicands.

Example 15 includes the device of Example 13, wherein the set of registers store the given bit location of respective ones the set of multiplicands.

Example 16 includes the device of Example 9, wherein: the first storage location comprises a resistive random access memory (RRAM); and the second storage location comprises a static random access memory (SRAM).

Example 17 includes the device of Example 9, further comprising: the first storage location including a first portion configured to store a set of multipliers of a first matrix and a second portion configured to store a set of multipliers of a second matrix; the second storage location including a first portion configured to store a set of multiplicands of a third matrix and a second portion configured to store a set of multiplicands of a fourth matrix; the bit masking logic further configured to sequentially access respective rows of the first and second portions of the second storage location; and logic OR circuitry configured to OR a give bit position of the given accessed row of the first and second portion of the second storage location; the bit masking logic further configured to conditionally sequentially access a corresponding row of the first and second portions of the first storage location when the logic OR of the given bit position of the given accessed row of the first and second portions of the second storage location is a non-zero value; the logic AND circuitry further configured to conditionally bitwise AND the given bit position of the given row of the second storage location and the given row of the first storage location when the logic OR of the given bit position of the given accessed row of the first and second portions of the second storage location is a non-zero value; and the one or more accumulators further configured to conditionally accumulate the partial products for the given bit position when the logic OR of the given bit position of the given accessed row of the first and second portions of the second storage location is a non-zero value.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:
1. A device comprising:
a first storage location configured to store a set of multipliers;
a second storage location configured to store a set of multiplicands;
a bit skipping logic configured to determine rows for a given bit position in the second storage location that hold non-zero values;
one or more readout circuitry configured to;
  sequential bias rows of the first storage location corresponding to non-zero value rows for the given bit position in the second storage location; and
  sequentially sense the rows of the first storage location, corresponding to the rows for the given bit position in the second storage location containing non-zero values, to determine partial products for the given bit position;
one or more accumulators configured to accumulate the determined partial products for the given bit position; and
one or more shift registers configured to shift the accumulated values, after sequentially accumulating the determined partial products for the plurality of bit positions over the plurality of rows of the first storage location, as a matrix dot product of the set of multipliers and the set of multiplicands.

2. The device of claim 1, further comprising:
an early termination logic configured to determine if a current accumulated partial product satisfies a predetermined criteria after a predetermined number of bit positions of the set of multiplicands in the second storage location have been processed.

3. The device of claim 2, wherein the early termination logic is configured to determine if a current accumulated partial product is less than zero.

4. The device of claim 1, further comprising:
a buffer configured to conditionally buffer the current accumulated value, after sequentially accumulating the determined partial products for the plurality of bit positions over the plurality of rows of the first storage location, if the current accumulated value satisfies a predetermined criteria.

5. The device of claim 1, wherein:
the first storage location comprises a resistive random access memory (RRAM); and
the second storage location comprises a set of registers.

6. The device of claim 5, wherein the set of registers store respective ones of the set of multiplicands.

7. The device of claim 5, wherein the set of register store the given bit location of respective ones the set of multiplicands.

8. The device of claim 1, wherein:
the first storage location comprises a resistive random access memory (RRAM); and
the second storage location comprises a static random access memory (SRAM).

9. A device comprising:
a first storage location configured to store a set of multipliers;
a second storage location configured to store a set of multiplicands;
a bit masking logic configured to;
    sequentially access respective rows of the second storage location to determine if a given bit position of the given row in the second storage location is a non-zero value; and
    conditionally sequentially accessing rows of the first storage location corresponding to given rows in the second storage location when a given bit position of the given row in the second storage location is a non-zero value;
logic AND circuitry configured to conditionally bitwise AND the given bit position of the given row of the second storage location and the given row of the first storage location, when the given bit position of the given row in the second storage location is a non-zero value to generate partial products for the given bit position;
one or more accumulators configured to conditionally accumulate the partial products for the given bit position when the bit position of the given row in the second storage location is a non-zero value;
one or more shift registers configured to shift the accumulated value in a corresponding direction, wherein the given bit position in the second storage location is sequentially shifted in a predetermined direction.

10. The device of claim 9, further comprising:
an early termination logic configured to determine if a current accumulated partial product satisfies a predetermined criteria after a predetermined number of bit positions of the set of multiplicands in the second storage location have been processed.

11. The device of claim 10, wherein the early termination logic is configured to determine if a current accumulated partial product is less than zero.

12. The device of claim 9, further comprising:
a buffer configured to conditionally buffer the current accumulated value, after sequentially accumulating the determined partial products for the plurality of bit positions over the plurality of rows of the first storage location, if the current accumulated value satisfies a predetermined criteria.

13. The device of claim 9, wherein:
the first storage location comprises a resistive random access memory (RRAM); and
the second storage location comprises a set of registers.

14. The device of claim 13, wherein the set of registers store respective ones of the set of multiplicands.

15. The device of claim 13, wherein the set of registers store the given bit location of respective ones the set of multiplicands.

16. The device of claim 9, wherein:
the first storage location comprises a resistive random access memory (RRAM); and
the second storage location comprises a static random access memory (SRAM).

17. The device of claim 9, further comprising:
the first storage location including a first portion configured to store a set of multipliers of a first matrix and a second portion configured to store a set of multipliers of a second matrix;
the second storage location including a first portion configured to store a set of multiplicands of a third matrix and a second portion configured to store a set of multiplicands of a fourth matrix;
the bit masking logic further configured to sequentially access respective rows of the first and second portions of the second storage location; and
logic OR circuitry configured to OR a give bit position of the given accessed row of the first and second portion of the second storage location;
the bit masking logic further configured to conditionally sequentially access a corresponding row of the first and second portions of the first storage location when the logic OR of the given bit position of the given accessed row of the first and second portions of the second storage location is a non-zero value;
the logic AND circuitry further configured to conditionally bitwise AND the given bit position of the given row of the second storage location and the given row of the first storage location when the logic OR of the given bit position of the given accessed row of the first and second portions of the second storage location is a non-zero value; and
the one or more accumulators further configured to conditionally accumulate the partial products for the given bit position when the logic OR of the given bit position of the given accessed row of the first and second portions of the second storage location is a non-zero value.

* * * * *